United States Patent
Botti et al.

(10) Patent No.: US 12,542,522 B2
(45) Date of Patent: Feb. 3, 2026

(54) SWITCHING CIRCUIT, CORRESPONDING DEVICE AND METHOD

(71) Applicant: STMicroelectronics S.r.l., Agrate Brianza (IT)

(72) Inventors: Edoardo Botti, Vigevano (IT);
Francesco Stilgenbauer, Rho (IT);
Marco Raimondi, Busto Garolfo (IT);
Elena Cussotto, Robecco sul Naviglio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 384 days.

(21) Appl. No.: 18/206,331

(22) Filed: Jun. 6, 2023

(65) Prior Publication Data
US 2023/0412129 A1 Dec. 21, 2023

(30) Foreign Application Priority Data
Jun. 15, 2022 (IT) .................. 102022000012683

(51) Int. Cl.
*H03F 3/217* (2006.01)
*H03F 1/02* (2006.01)

(52) U.S. Cl.
CPC ....... *H03F 3/2173* (2013.01); *H03F 2200/03* (2013.01); *H03F 2200/171* (2013.01); *H03F 2200/351* (2013.01)

(58) Field of Classification Search
CPC .............. H03F 3/2173; H03F 2200/03; H03F 2200/171; H03F 2200/351; H03F 3/185; H03F 1/0205; H03K 17/08122; H03K 17/08142; H03K 17/162

USPC ....................................... 330/10, 251, 207 A
See application file for complete search history.

(56) References Cited

U.S. PATENT DOCUMENTS 8,674,757 B2 * 3/2014 Wu ................ H03F 3/217
327/434
10,749,474 B2 8/2020 Botti et al.

FOREIGN PATENT DOCUMENTS

EP 3522373 B1 1/2019

OTHER PUBLICATIONS

IT Search Report and Written Opinion for priority application, IT Appl. No. 102022000012683, report dated Jan. 13, 2023, 8 pgs.

* cited by examiner

*Primary Examiner* — Hieu P Nguyen
(74) *Attorney, Agent, or Firm* — Crowe & Dunlevy LLC

(57) ABSTRACT

A switching circuit includes first and second half bridges supplying an electrical load via filter networks. During alternate switching sequences a first transistor pair (high-side in one half bridge and low-side in the other half bridge) is switched to a non-conductive state, and a second transistor pair (high-side in the other half bridge and low-side in the one half bridge) is switched to a conductive state. A current flow line is provided by an inductance, a first switch and a second switch between outputs of the half bridges. In a medium-high power mode, the first and second switches are in the conductive state between switching the first pair of transistors to the non-conductive state and the second pair of transistors to the conductive state. In a low or quiescent power mode, switching the first and second switches to the conductive state is refrained due to application of a longer delay.

24 Claims, 15 Drawing Sheets

SWITCHING CIRCUIT, CORRESPONDING DEVICE AND METHOD

PRIORITY CLAIM

This application claims the priority benefit of Italian Application for Patent No. 102022000012683 filed on Jun. 15, 2022, the content of which is hereby incorporated by reference in its entirety to the maximum extent allowable by law.

TECHNICAL FIELD

The description relates to switching circuits.

One or more embodiments may be applied, for instance, to bridge switching power stages in Class D bridge power amplifiers.

BACKGROUND

Power dissipation is an important parameter of a switching power stage.

Reducing inasmuch as possible power dissipation is desirable not only at medium and high output power levels but also at low-power levels and in quiescent conditions: in audio power devices, the nature of the signal is such that a non-negligible portion of the total operating time lies in an area ranging from Pout=0 (zero output power, that is, quiescent state) to an output power Pout less than $\frac{1}{100}$ of the maximum output power.

For that reason, in addition to the power dissipated during high-signal operation, the power dissipated during low-signal operation and in quiescent state plays a role: power dissipated in these latter conditions affects the sizing of an associated heatsink and, in the case of battery-powered devices, the duration of the battery used to supply the device.

The automotive market is an area where dissipated power targets in various conditions (including operation at low output power) are becoming increasingly stringent.

Reducing power dissipation for medium-low to high output powers has already been considered, for instance, in U.S. Patent Publication No. 2019/0238094 (corresponding to EP 3522373 B1), the contents of which are incorporated herein by reference.

In that document, a switching circuit stage configured to supply a load via filter networks is disclosed including control circuitry configured to control alternate switching sequences of transistors in the half-bridges of the switching circuit stage. A current flow line is provided between the output nodes of the half-bridges including an inductance between two switches. First and second capacitances are coupled with the output nodes of the half-bridges. The control circuitry switches first and second switches to the conductive state at intervals in the alternate switching sequences of the transistors in the half-bridges between switching the first pair of transistors to a non-conductive state and switching the second pair of transistors to a conductive state.

There is a need in the art to contribute in providing an improved solution with reduced power dissipation with attention paid to low-power operation and/or quiescent state conditions.

SUMMARY

One or more embodiments may relate to a circuit.

One or more embodiments may relate to a corresponding device (e.g., a class D audio power amplifier).

One or more embodiments may relate to a corresponding method.

In an embodiment, a circuit comprises: a switching circuit stage and control circuitry. The switching circuit stage comprises first and second half bridges comprising a first, high-side transistor and a second, low-side transistor, the first half bridge and the second half bridge comprising respective output nodes between the high-side transistor and the low-side transistor therein, the output nodes configured for supplying an electrical load via respective filter networks between the output nodes and the load. The control circuitry is configured to control alternate switching sequences of the high-side and low-side transistors in the first and second half bridges wherein a first pair of transistors comprising the high-side transistor in one of the half bridges and the low-side transistor in the other of the half bridges is switched to a non-conductive state, and a second pair of transistors comprising the high-side transistor in the other of the half bridges and the low-side transistor in the one of the half bridges is switched to a conductive state.

The circuit further comprises: a current flow line between the output nodes in the first half bridge and the second half bridge, the current flow line comprising an inductance having opposed terminals coupled to a first switch and a second switch, the first switch and the second switch selectively switchable between a non-conductive state and at least one conductive state; and first and second capacitances coupled with the output nodes of the first half bridge and the second half bridge.

The control circuitry is configured to operate, alternatively: in a first operation mode, wherein the control circuitry switches the first switch and the second switch to the at least one conductive state at intervals in said alternate switching sequences in response to switching the first pair of transistors to a non-conductive state and to switching the second pair of transistors to a conductive state; aor in a second operation mode, wherein the control circuitry refrains from switching the first switch and the second switch to the at least one conductive state at intervals in said alternate switching sequences in response to switching the first pair of transistors to a non-conductive state and to switching the second pair of transistors to a conductive state.

In an embodiment, a device comprises: a PWM modulator to receive an input signal and to produce therefrom a PWM-modulated drive signal; a circuit as described above coupled with the PWM modulator where the first and second half bridges are configured to be driven by said PWM-modulated drive signals; and respective low pass filter networks coupled to the output nodes of the first and second half bridges.

In an embodiment, a method of amplifying an input signal comprises: applying an input signal to a PWM modulator in a device as described above; and obtaining an amplified replica of the input signal at said respective low pass filter networks coupled to the output nodes of the first and second half bridges.

BRIEF DESCRIPTION OF THE DRAWINGS

One or more embodiments will now be described, by way of example only, with reference to the annexed figures, wherein.

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

Also, for the sake of simplicity and ease of explanation, a same designation may be applied throughout this description to designate a circuit node or line as well as a signal occurring at that node or line.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
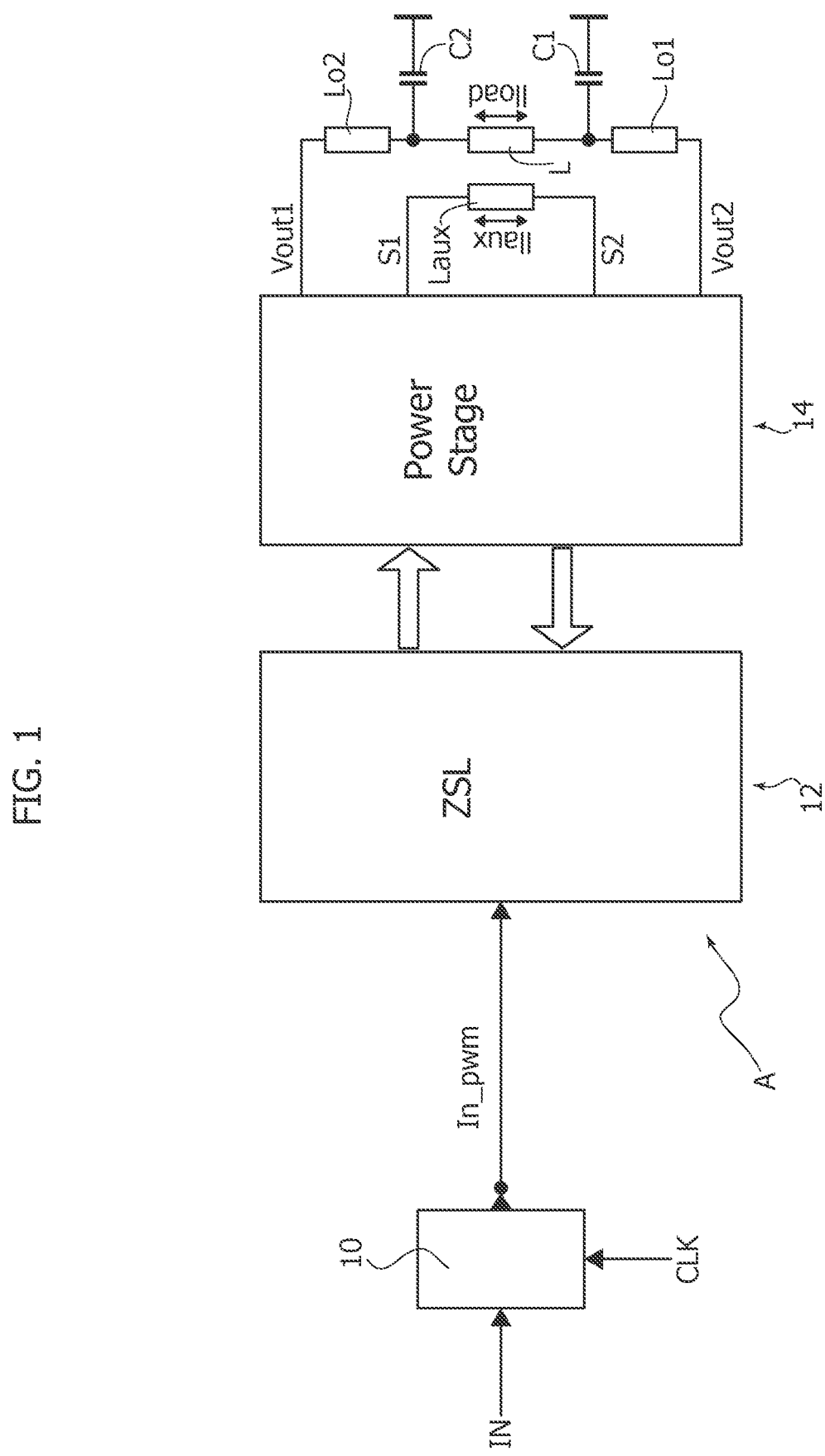
FIG. 1 is an exemplary block diagram of a switching amplifier with reduced switching losses.

FIG. 1 is an exemplary block diagram of a switching circuit such as a class D audio amplifier A (for use, e.g., in a car audio system) including a switching bridge architecture and elements to increase efficiency, including an inductance Laux.

As conventional in the art of such switching amplifiers a (voltage or current) input signal IN is applied to input circuitry 10 to be processed (in a manner known per se to those of skill in art) to produce a two-level PWM (pulse width modulation) modulated signal In-pwm clocked by a clock signal CLK. The average value of the signal In_pwm is proportional to the input signal IN, with a (fixed frequency) carrier defined by the clock signal CLK.

Figure 2:
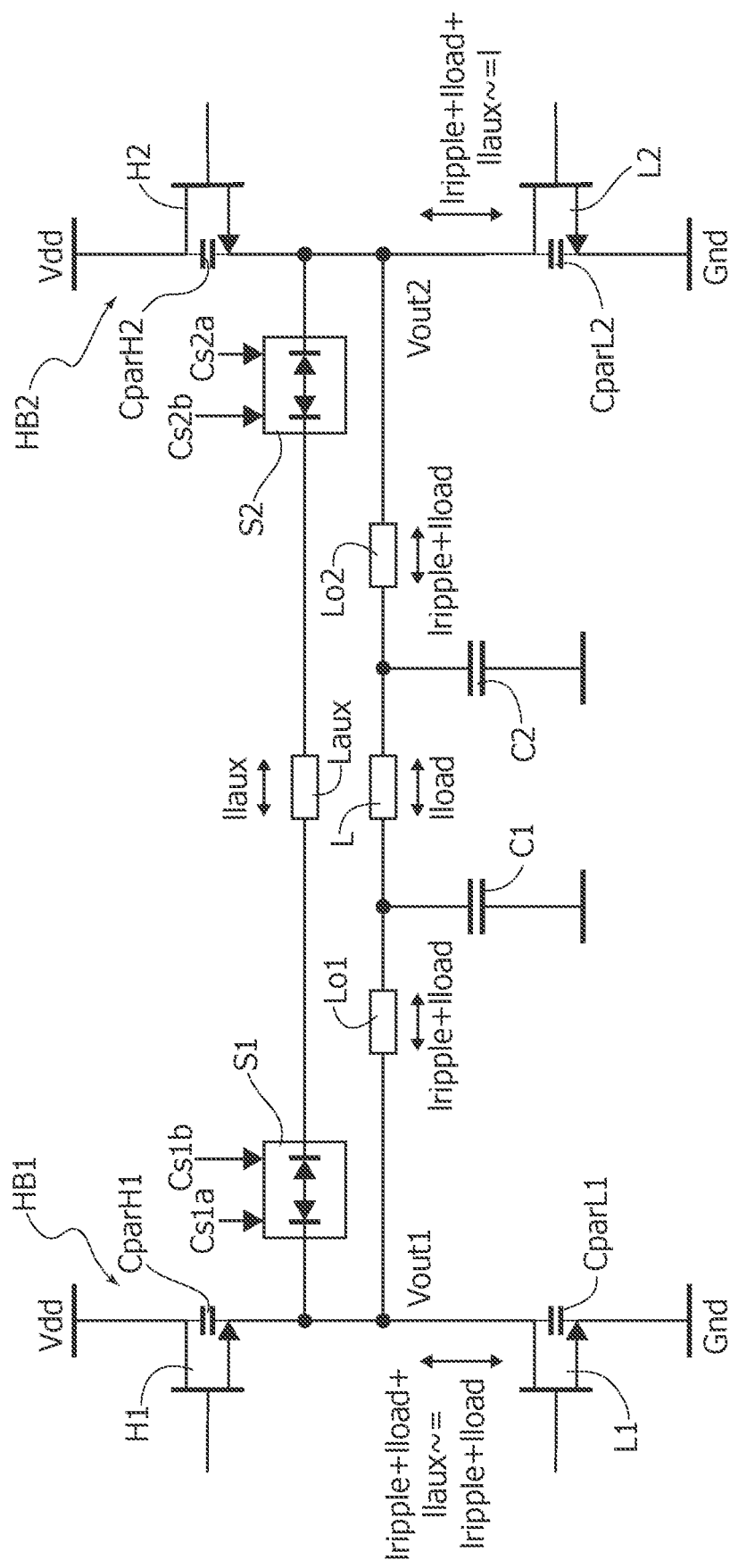
FIG. 2 is a circuit diagram exemplary of a power stage in an amplifier as illustrated in FIG. 1.

The PWM-modulated signal In_pwm is forwarded, via zero-switching loss (ZSL) circuitry 12 to a power stage 14 comprising, for instance four power transistors plus two switches according to the circuit topology illustrated in FIG. 2.

The circuit topology illustrated in FIG. 2 essentially corresponds to a solution disclosed in U.S. Patent Publication No. 2019/0238094 (corresponding to EP 3522373 B1), including two half bridge circuits HB1, HB2.

The two half-bridge circuits HB1, HB2 (each comprising a high-side switch H1, H2 and a low-side switch L1, L2, e.g., power MOSFET transistors) are driven by two signals In_pwm1, In_pvm2 corresponding to the signal In_pwm provided by the input circuit 10 and produce a PWM-modulated power signal across an LC output filter network comprising, e.g. respective inductances Lo1, Lo2 and capacitances C1, C2 in a mirror-symmetrical configuration.

In a class D bridge circuit as considered herein the two signals In_pwm1, In_pvm2 corresponding to the signal In_pwm and, consequently the outputs from the half bridges HB1, HB2) will have opposed phases (namely 180° phase shift): that is, either one of the signals Inpwm1 and Inpwm2 is a "negated" or "inverted" replica of the other.

An amplified version of the input signal IN will thus become available at a load L (assumed to have a resistance value Rload) coupled across a first node between the inductance Lo1 and the capacitance C1 and a second node between the inductance Lo2 and the capacitance C2.

The load L (and possibly the LC filter networks associated therewith) may be a distinct element from the amplifier A. Also, the two nodes Vout1, Vout2 will hereinafter be referred to as the "output" nodes (of the half bridges HB1, HB2) even though, strictly speaking, they do not represent the output nodes of the amplifier A (see, e.g., FIG. 1) having the load L coupled therebetween.

In the following discussion the following designations of signals/nodes/components will apply:

Pout=output power=Vout (rms)^2/Rload=Iout(rms)^2*Rload

Pin=input power=Power delivered by the supply=Vdd*Ivdd

Pdiss=power dissipation=Pin−Pout

Efficiency=Pout/Pin

Iload=current flowing in the load L (absolute value)

Tripple=current flowing in the output filter inductor in power switching stages. In quiescent condition it is a triangular wave with a value depending on the frequency, on the Vsupply and on the inductance value Iripple(peak)=peak value of Tripple (absolute value)

Rload(min)=Minimum (resistance) value of the load L

Vthr=Iripple(peak)*Rload. Output voltage threshold for which Iload=Tripple

Vds(L1), Vds(L2)=voltage between drain and source of L1, L2, positive when >0

Vds(H1), Vds(H2)=voltage between drain to source of H1, H2, positive when >b0

An arrangement as illustrated in FIG. 2 comprises a current flow line between the output nodes Vout1, Vout2 in the first half bridge HB1 and the second half bridge HB2.

The current flow line between the output nodes Vout1, Vout2 comprises an inductance Laux having opposed terminals coupled to a first switch S1 and a second switch S2. The switches S1, S2 can be incorporated in the same (monolithic) integrated circuit of the amplifier A (see FIG. 1).

The first switch S1 and the second switch S2 are selectively switchable (via signals Cs1a, Cs1b and Cs2a, Cs2b) between a non-conductive state and at least one conductive state.

Figure 2A:
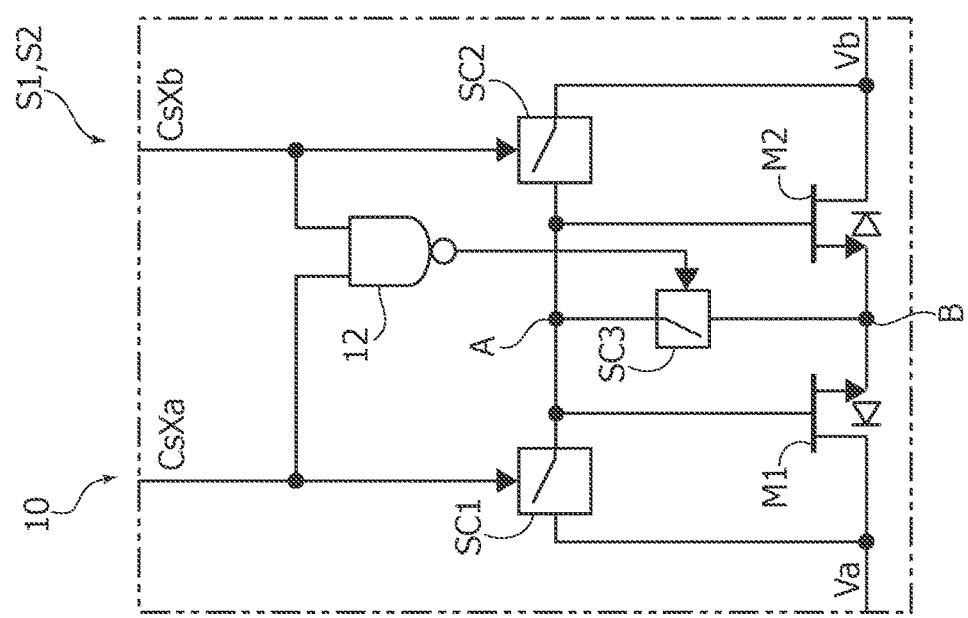
FIG. 2A is a circuit diagram exemplary of a possible implementation of certain elements in the power stage illustrated in FIG. 2.

In a possible implementation illustrated in FIG. 2A, the switches S1 and S2 include a first and a second (e.g., MOSFET) transistor M1, M2 having their control electrodes (e.g., gates, in the exemplary case of field effect transistors) coupled at a first common node A and the current paths therethrough (e.g., source-drain in the exemplary case of field effect transistors) coupled at a second common node B in an anti-series arrangement. A first electrical path is connected between the first common node A and the current path through the first transistor M1 (at the terminal, e.g., drain) opposed the second transistor M2. The first electrical path comprises a first switch SC1 switchable between a conductive state and a non-conductive state. A second electrical path is connected between the first common node A and the current path through the second transistor (at the terminal, e.g., drain) opposed the first transistor. The second electrical path comprises a second switch SC2 switchable between a conductive state and a non-conductive state. A third electrical path is connected between the first common node A and the second common node B. The third electrical path comprises a third switch SC3 switchable between a conductive state and a non-conductive state; and a logical network (e.g., a NAND gate G12) coupling the third switch SC3 with the first and second switches SC1, SC2.

The logical network is configured to switch the third switch SC3: a) to the conductive state with both the first switch SC1 and the second switch SC2 switched to the non-conductive state; and b) to the non-conductive state with either one of the first switch SC1 and the second switch SC2 switched to the conductive state.

The circuit FIG. 2A can be selectively brought to: an "off" operating condition, wherein the first and the second switches SC1 and SC2 are non-conductive, thereby impeding current flow in the current line between a first and a second electrical line nodes Va and Vb with the third switch conductive; and either one of two "on" operating conditions a) or b). Wherein: in condition a) the first switch SC1 is conductive and the second switch SC2 is non-conductive with the third switch SC3 non-conductive, thereby facilitating current flow in the current line from Va to Vb; or in condition b) the first switch SC1 is non-conductive and the second switch SC2 is conductive with the third switch SC3 non-conductive, thereby facilitating current flow in the current line from Vb to Va.

Switching of such a switch circuit as exemplified in FIG. 2A thus involves two control signals, namely CsXa, CsXb, with X=1 or 2 (that is, these can be distinguished as Cs1a and Cs1b for the switch S1 and as Cs2a and Cs2b for the switch S2) so that, with both these signals at a first level (e.g., 0), the switch (e.g., S1, S2—see the basic exemplary diagram of FIG. 2) is in an open, non-conductive state.

Selectively controlling CsXa and CsXb with either one of the switches SC1, SC2 brought to a conductive state (while the switch SC3 is non-conductive in both instances) makes the switch conductive (that is "closed") in the one or the other of the directions of current flow through Laux (see again the basic exemplary diagram of FIG. 2).

FIG. 2 illustrates first and second capacitances coupled with the output nodes Vout1, Vout2 of the first half bridge HB1 and the second half bridge HB2, with the associated control circuitry 12 (illustrated in FIG. 4) configured to switch the first and second switches S1 and S2 to the conductive state at respective intervals (ta, tb; t1, t2—see FIG. 3, to be discussed in the following) in an alternate switching sequence between switching the first pair of transistors to a non-conductive state and switching the second pair of transistors to a conductive state.

The inductance Laux may comprise either a distinct inductive component of the circuit (as illustrated in FIG. 2) and/or an electrically conductive line (e.g., a trace on a printed circuit board of PCB) coupling the first switch S1 and the second switch S2, the electrically conductive line having a line inductance.

Likewise, the first and second capacitances may comprise either distinct capacitive components of the circuit coupled between the output nodes Vout1, Vout2 of the first and second half bridges HB1, HB2 and ground, and/or (as illustrated in FIG. 2) parasitic capacitances CparH1, CparL1, CparH2, CparL2 of the high-side and the low-side transistors in the first and second half bridges HB1, HB2.

The solution disclosed in U.S. Patent Publication No. 2019/238094 (EP 3522373 B1), already cited, is based on the recognition that, in a circuit as considered herein, a significant contribution to power dissipation is due to the transition where the transistor which is in the process of being activated discharges the charge stored in its body diode. If the transition is a fast one, such a current may be appreciably higher than Iout.

This leads to a correspondingly high power dissipation insofar as the drain-source voltage Vds is nearly equal to Vdd (the supply voltage of the two half bridges HB1, HB2).

If one considers that the two half bridges HB1, HB2 may switch simultaneously, such a critical transition may take place simultaneously with a correspondingly high current flow. That solution disclosed in U.S. Patent Publication No. 2019/238094 (EP 3522373 B1), already cited, facilitates providing a circuit suited for use, e.g., in a class D audio amplifier of the monolithic type having high switching frequency with the capability of reducing the amount of power dissipated as a result of switching (e.g., due to the critical transitions discussed previously) while improving linearity.

Figure 3:
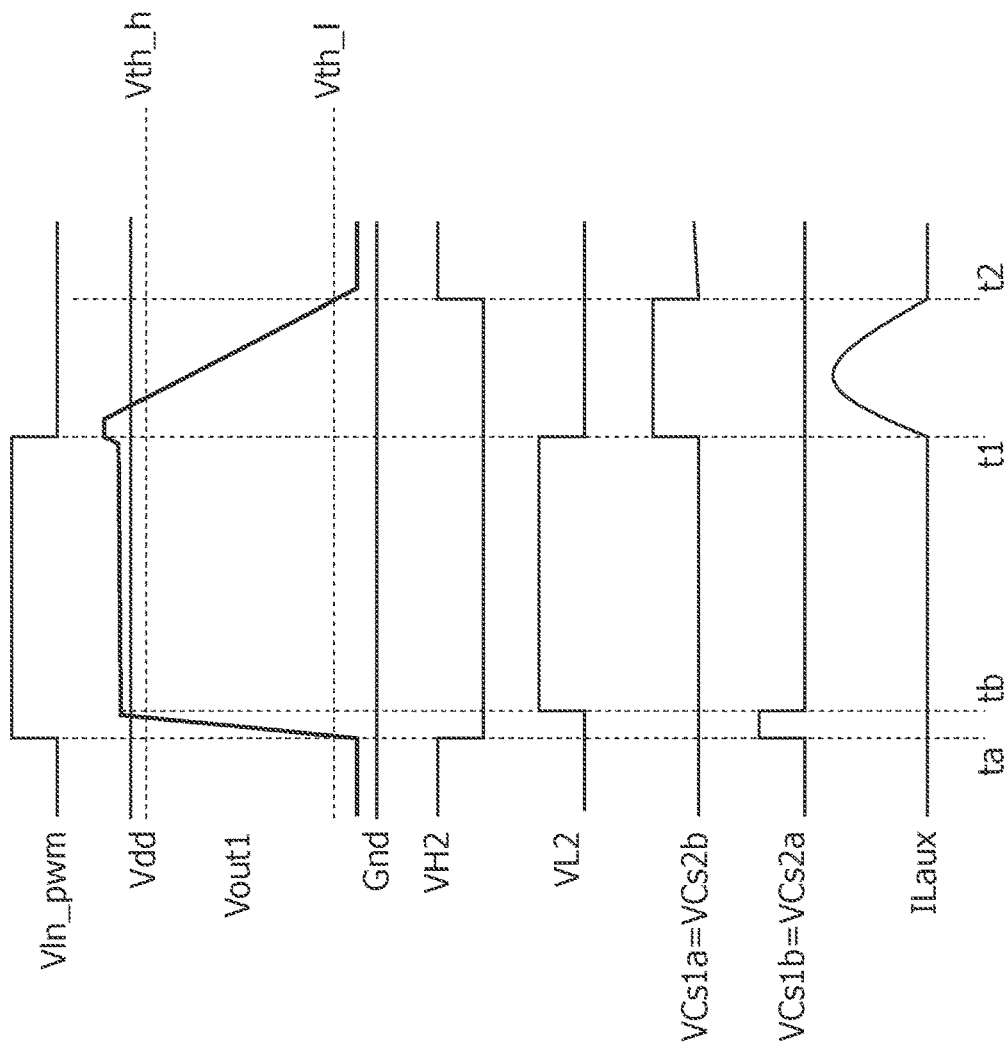
FIG. 3 includes various diagrams sharing a common time scale exemplary of the possible time behavior of certain signals which may occur in an amplifier as illustrated in FIG. 1.

The diagrams in FIG. 3 are exemplary of a possible time behavior of various signals as discussed U.S. Patent Publication No. 2019/238094 (EP 3522373 B1), assuming (as it may reasonably be the case) complementary PWM-modulated behaviors of In_pwm1 and In_pwm2 (generally labeled Vin_pwm in the top diagram of FIG. 3).

The second diagram in FIG. 3 shows the behavior of the signal Vout1: the signal Vout2 will exhibit the same behavior in a complementary manner, that is, with Vout2 "low" when Vout1 is "high" and Vout2 "high" when Vout1 is "low".

The third and fourth diagrams in FIG. 3 portray the on and off conditions of the high-side and low-side transistors (H2 and L2, respectively) in the half bridge HB2. For the sake of brevity, only the behavior of the half bridge HB2 (including the high-side transistor H2 and the low-side transistor L2) is exemplified: as noted, the same behavior is in fact mirrored in the half bridge HB1 in a complementary way (180° phase offset) due to the complementary time behavior of In_pwm1 and In_pwm2. The fifth and sixth diagrams in FIG. 3 portray possible control signals VCs1$a$=VCs2$b$ and VCs1$b$=VCs2$a$ applied to the switches S1 and S2, by assuming that an "on" or "high" value corresponds to the associated switch being made conductive and an "off" or "low" value corresponds to the associated switch being made non-conductive.

Figure 11:
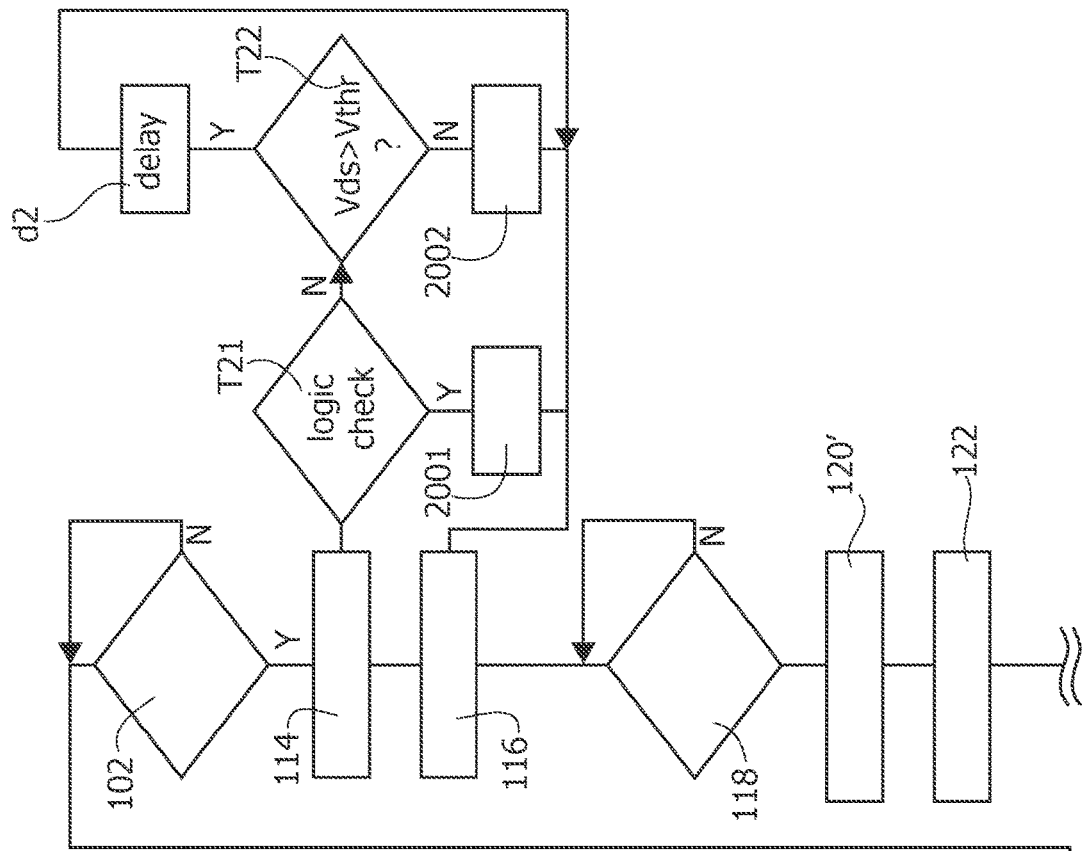

Two distinct control signals, VCsXa and VCsXb, with X=1 or 2, namely VCs1$a$, VCs1$b$ (for switch S1) and VCs2$a$, VCs2$b$ (for switch S2) are shown herein in view of the possibility of implementing the switches S1, S2 as exemplified in FIG. 2A (FIG. 11 of U.S. Patent Publication No. 2019/238094 (EP 3522373 B1) discussed in the foregoing (which is, of course, non mandatory).

Finally, the lowermost diagram in FIG. 3 shows a possible time behavior of the current ILaux through the auxiliary inductance Laux.

This type of operation, including alternate switching sequences of the high-side transistors H1, H2 and the low-side transistors L1, L2 in the half bridges HB1, HB2 is conventional in the art, thus making it unnecessary to provide a more detailed description herein.

The representation of FIG. 3 shows—with reference to the case where Iload is larger than the peak value of the ripple current Iripple(peak)—that the switches S1, S2 can be implemented (for instance resorting to two MOS transistors in an anti-series or back-to-back arrangement as discussed, e.g. in FIG. 2A) in such a way that the switches S1 and S2 can be made selectively conductive in either one of the flow directions of the current therethrough, namely in the one flow direction which under the circumstances facilitates discharging the charge of the body diode of L1 (and L2).

This makes it possible to null the "contrary" current ILaux through the inductance Laux, e.g., during the interval ta, tb.

Figure 4:
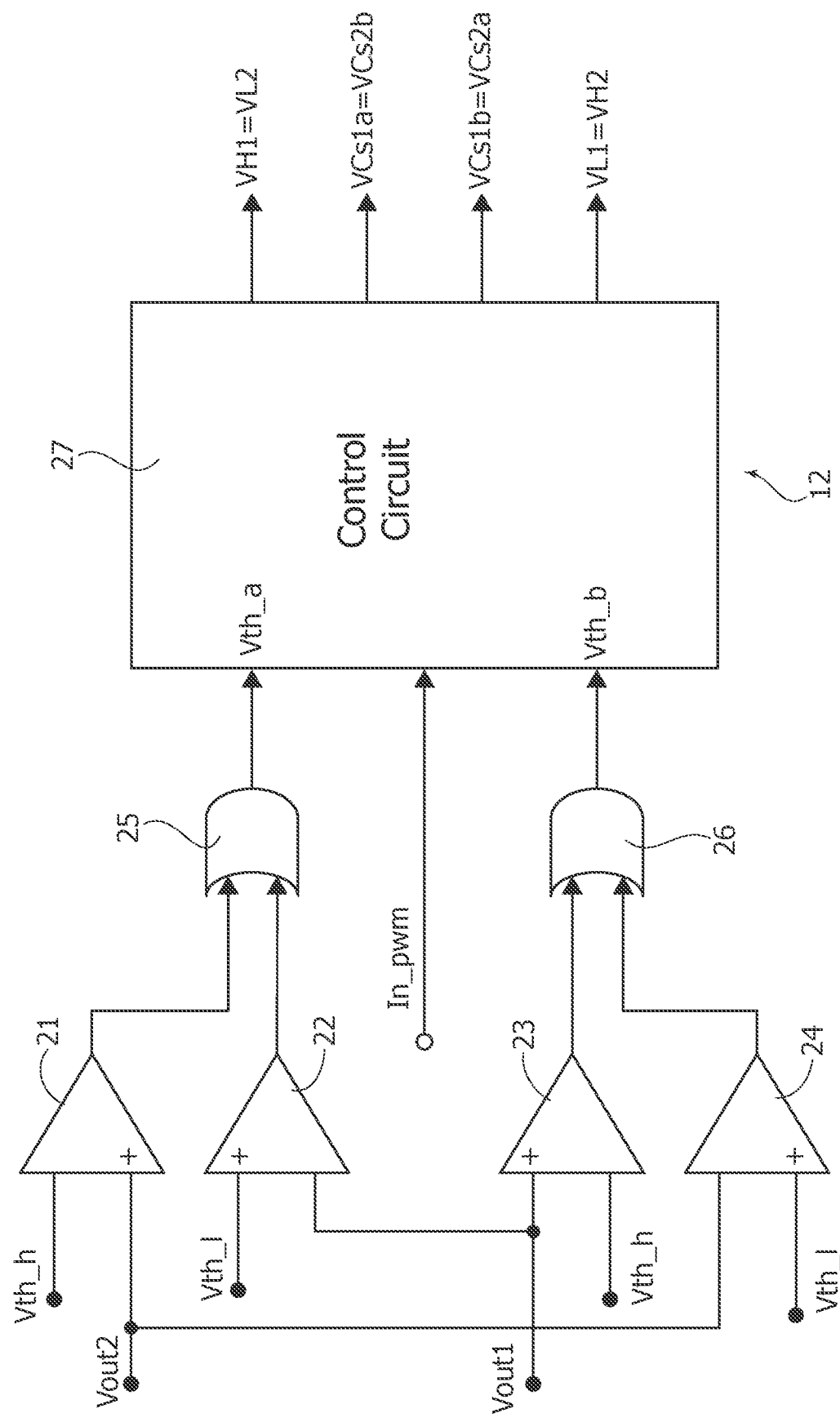
FIG. 4 is a diagram exemplary of control circuitry that can be coupled to a power stage as illustrated in FIG. 2 to produce operation as exemplified in FIG. 3.

The diagram of FIG. 4 is exemplary of control circuitry 12 that can be coupled to a power stage as illustrated in FIG. 2 to produce operation as exemplified in FIG. 3.

Circuitry 12 as illustrated in FIG. 4 includes four comparators 21, 22, 23, 24 that compare the signals Vout1, Vout2 at the nodes between the high-side and the low-side transistors (H1, H2 and L1, L2, respectively) with threshold values Vth_h, Vth_l which may be made possibly adjustable as setting parameters of the circuit.

For instance, in an embodiment as exemplified in FIG. 4 the possible connection of the comparators 21 to 24 may comprise: comparator 21 (Vout2—non inverting input, Vth_h inverting input); comparator 22 (Vout1—inverting input, Vth_l—non inverting input); comparator 23 (Vout1—non inverting input, Vth_h—inverting input); and comparator 24 (Vout2—inverting input, Vth_l—non inverting input).

The outputs from the comparators 21, 22 and the outputs from the comparators 23 and 24 are input to OR gates 25, 26 that provide corresponding signals to respective inputs of a control circuit block 27 which switches the switches S1, S2 on (conductive state) and off (non-conductive state).

For instance, the signals from the OR gates 25, 26 may provide to the circuit block 27 two input signals at Vth_a and Vth_b which facilitate turning off the switches S1, S2 as discussed previously while turning on of these switches may be controlled by the rising/falling edges of either one of the signals In_pwm1 or In_pwm2. For that reason, the generic indication In_pwm without suffixes 1 or 2 is reproduced in FIG. 4.

In the diagram of FIG. 4 four output lines are exemplified from the control circuit 27, where: VH1=VL2 are the control signals applied to the control terminals (e.g., gates) of the power transistors H1 and L2; VCs1$a$=VCs2$b$ and VCs1$b$=VCs2$a$ are the control signals of the switches S1 and S2 (see FIGS. 2 and 2A); and VL1=VH2 are the control signals applied to the control terminals (e.g., gates) of the power transistors L1 and H2.

For the sake of explanation and by way of example throughout this description a switch such as a transistor will be considered to be "on" (active/conductive) when the control signal is "high" and "off" (inactive/non-conductive) when the control signal is "low". Those of skill in the art can of course devise other implementations of the same operating principles and functions.

Figure 5:
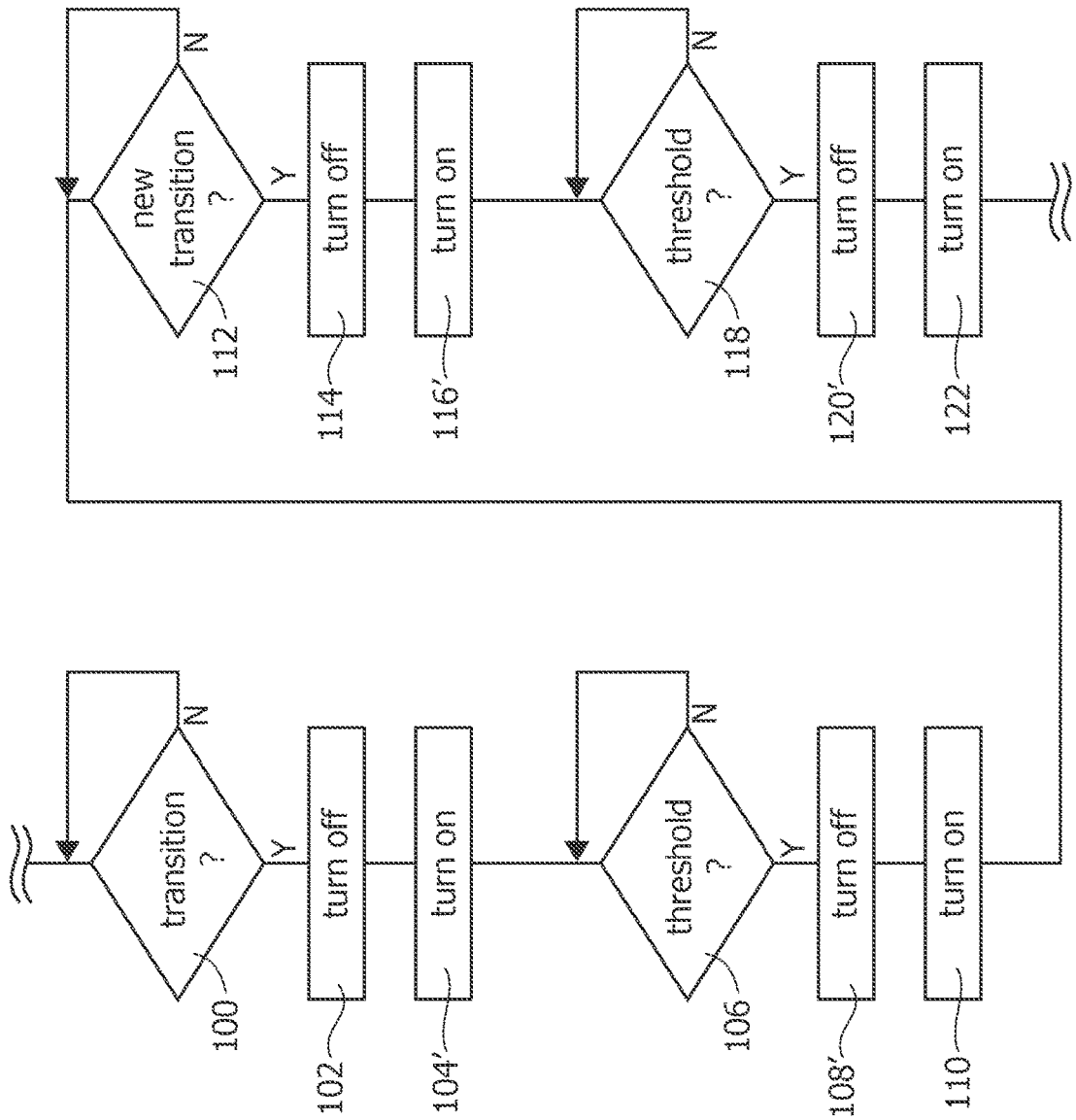
FIG. 5 is a flow chart exemplary of a possible mode of operation of an amplifier as illustrated in the previous figures.

The flow chart in FIG. 5 is exemplary of possible cyclical operation of an arrangement as discussed in the foregoing, starting from an initial condition where: VL1=VH2=1 (that is, L1 and H2 conductive); VH1=VL2=0 (that is, H1 and L2 non conductive); and VCs1$a$=Vcs2$b$=0 and VCs1$b$=VCs2$a$=0 (that is, S1 and S2 non-conductive).

The blocks in the diagram of FIG. 5 identify the following steps or actions:

100: check as to whether a transition (e.g., 0→1) has occurred in the input signal In_pwm (here again the suffixes 1 and 2 are not reproduced for the reasons given previously).

102: given a positive outcome in block 100, the currently active power transistors are turned off (e.g., VL1=VH2 1→0).

104': the switches CS1-CS2 are activated, that is made conductive (e.g., Vcs1=Vcs2 0→1).

106: check as to whether the "turn-off" threshold has been reached (e.g., Vth_a 0→1).

108': given a positive outcome in block 106, the switches S1, S2 are turned off, that is made non-conductive (e.g., Vcs1=Vcs2 1→0).

110: the currently inactive power transistors are turned on (e.g., VH1=VL2 0→1).

112: check as to whether a new transition has occurred in the input signal In_pwm.

114: given a positive outcome in block 112, the currently active power transistors are turned off (e.g. VH1=VL2 1→0).

116': the switches CS1-CS2 are activated, that is, made conductive (e.g., Vcs1=Vcs2 0→1).

118: check as to whether the "turn-off" threshold has been reached (e.g., Vth_b 0→1).

120': given a positive outcome in block 116, the switches 51, S2 are turned off, that is made non-conductive (e.g., Vcs1=Vcs2 1→0).

122: the currently inactive power transistors are turned on (e.g., VL1=VH2 0→1).

The process then continues (for example, returns to 100).

Structure and operation of a power stage in a switching amplifier A as discussed so far is essentially in line with the disclosure of U.S. Patent Publication No. 2019/238094 (EP 3522373 B1), already repeatedly cited: those documents can be referred to for further detail and information.

The previous discussion primarily refers to the case where the current Iload through the load L is larger than the peak value of the ripple current Iripple(peak) through the output filter impedances.

In such a situation, as portrayed, e.g., in FIG. 3 the output PWM waveform (before the LC output filter) corresponds to a current steadily flowing into the output node. This is typical of medium and high output power levels of a switching amplifier.

In low-power and quiescent conditions the current Iload through the load L is expectedly smaller than the peak value of the ripple current Iripple(peak).

Figure 6:
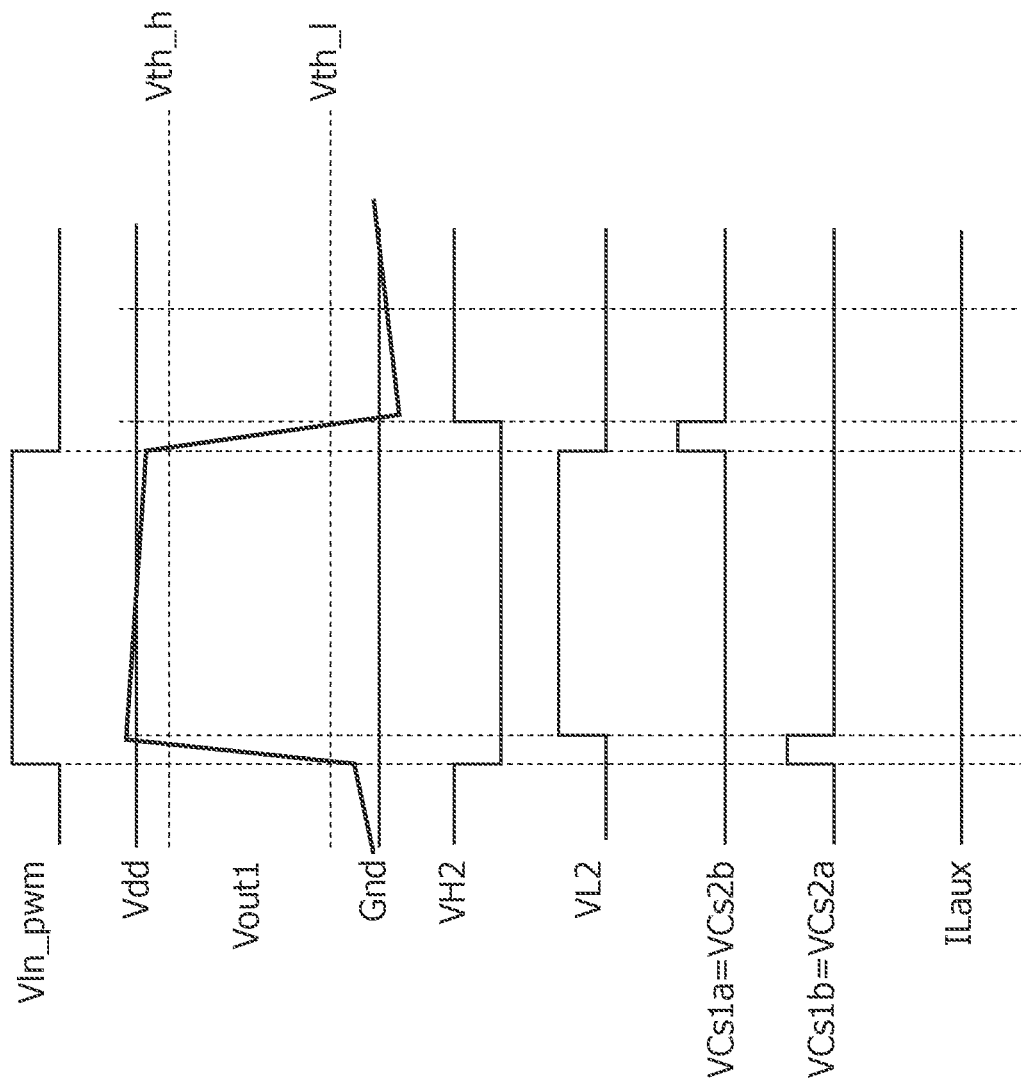
FIG. 6 includes various diagrams sharing a common time scale exemplary of the possible time behavior of certain signals that may occur in an amplifier as illustrated in FIG. 1.

This may result in the behavior portrayed in FIG. 6.

Here again, the complementary PWM-modulated behaviors of In_pwm1 and In_pwm2 are generally labeled Vin_pwm in the top diagram of FIG. 6.

The second diagram in FIG. 6 shows the behavior of the signal Vout1: the signal Vout2 will exhibit the same behavior in a complementary manner, that is, with Vout2 "low" when Vout1 is "high" and Vout2 "high" when Vout1 is "low".

The third and fourth diagrams in FIG. 6 portray the on and off conditions of the high-side and low-side transistors (H2 and L2, respectively) in the half bridge HB2. Here again, only the behavior of the half bridge HB2 (including the high-side transistor H2 and the low-side transistor L2) is exemplified: the same behavior is in fact mirrored in the half bridge HB1 in a complementary way (180° phase offset) due to the complementary time behavior of In_pwm1 and In_pwm2.

The fifth and sixth diagrams in FIG. 6 portray possible control signals VCs1$a$=VCs2$b$ and VCs1$b$=VCs2$a$ applied to the switches S1 and S2, by assuming that an "on" or "high" value corresponds to the associated switch being made conductive and an "off" or "low" value corresponds to the associated switch being made non-conductive.

Here again, two distinct control signals, VCsXa and VCsXb, with X=1 or 2, namely VCs1$a$, VCs1$b$ (for switch S1) and VCs2$a$, VCs2$b$ (for switch S2) are shown herein in view of the possibility of implementing the switches S1, S2 as exemplified in FIG. 2A discussed in the foregoing.

Finally, the lowermost diagram in FIG. 6 shows a possible time behavior of the (zero or nearly zero, that is, quiescent or nearly quiescent) current ILaux through the auxiliary inductance Laux.

In the case of Iload<Iripple(peak) the waveform for the voltage Vout1 (and complementarily, the voltage Vout2) is a rectangular waveform where—at each half-cycle of the output square waveform—the current changes sign (flow direction).

For instance, as shown in FIG. 6, in the area where the voltage Vout1 is near the value Vdd, the current is initially an inflow current that subsequently turns in into an outflow current before the 1→0 switch.

As a consequence, the voltage Vout1 is at first higher than the value Vdd, and then becomes lower than Vdd.

When the input switches from 1 to 0, in response to the transistor H1 being switched off, the voltage Vout1 can reach zero without the intervention of other active components in so far as the energy stored in the filter inductance is enough for that purpose.

Under these conditions, ZSL control circuitry 12 as illustrated in FIG. 4 and configured to activate the auxiliary switches S1 and S2 with a (negligible) delay in response to the transistor H1 being switched off is not necessary to bring the output to zero.

Activation of the ZSL control network 12 thus unnecessarily increases the dissipated power, and such an increase being non-negligible if one notes that this situation occurs in the case of an output signal that is zero or nearly zero.

Efficiency in such operating conditions can be improved by providing adequate delays (in the order of a few tens of ns, for example) between power-off and switch-on of the switches S1, S2 so that these switches do not intervene in these conditions, giving rise to what can be termed a "ZSL low power mode" (where ZSL=zero switching loss).

When in such a ZSL low power mode configuration, the system will operate adequately also for output currents higher than the ripple current, with slightly higher distortion.

This suggests that, in audio systems for which low-distortion is desired, the ZSL low power mode just discussed should be activated only in the region where Iload<Iripple (peak), with operation returning to normal ZSL operation (e.g., as disclosed in U.S. Patent Publication No. 2019/0238094 (EP 3522373 B1)) as soon as Iload>Tripple (peak).

Figure 7:
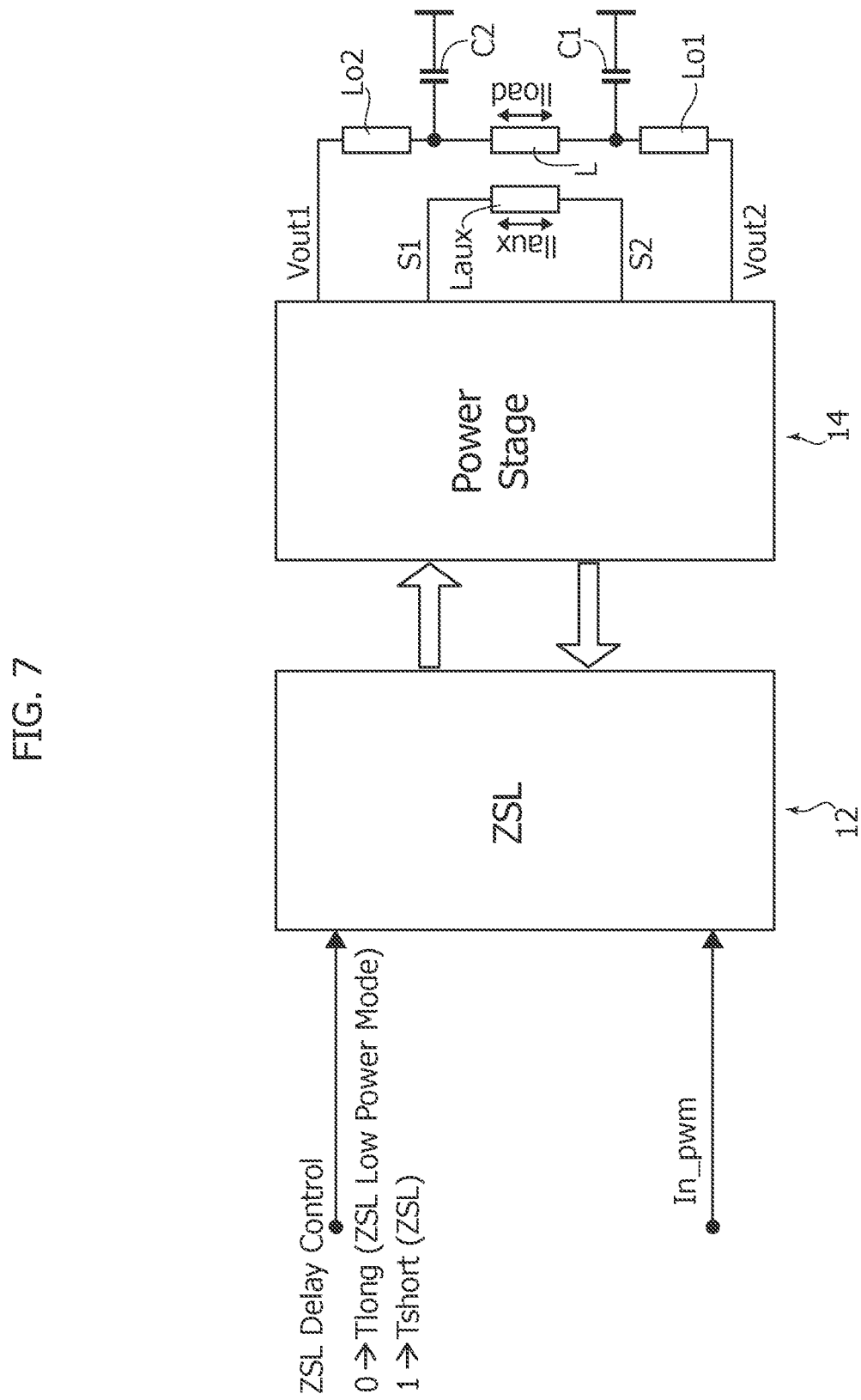
FIG. 7 is a block diagram illustrative of a possible modification of a switching amplifier in embodiments according to the present description.

FIG. 7 is exemplary of a possible way of activating a ZSL low power mode within the framework of an arrangement as presented in FIG. 1 (only the elements directly involved are shown in FIG. 7).

As exemplified in FIG. 7, a logical command signal ZSL Delay Control can be added.

With the ZSL Delay Control command at a first logic level (e.g., "0"), the delay between turning off the power transistors and turning on the switches S1, S2 has a first, "long" value Tlong (for example, 30 ns), and the system works in a ZSL low power mode.

Figure 8:
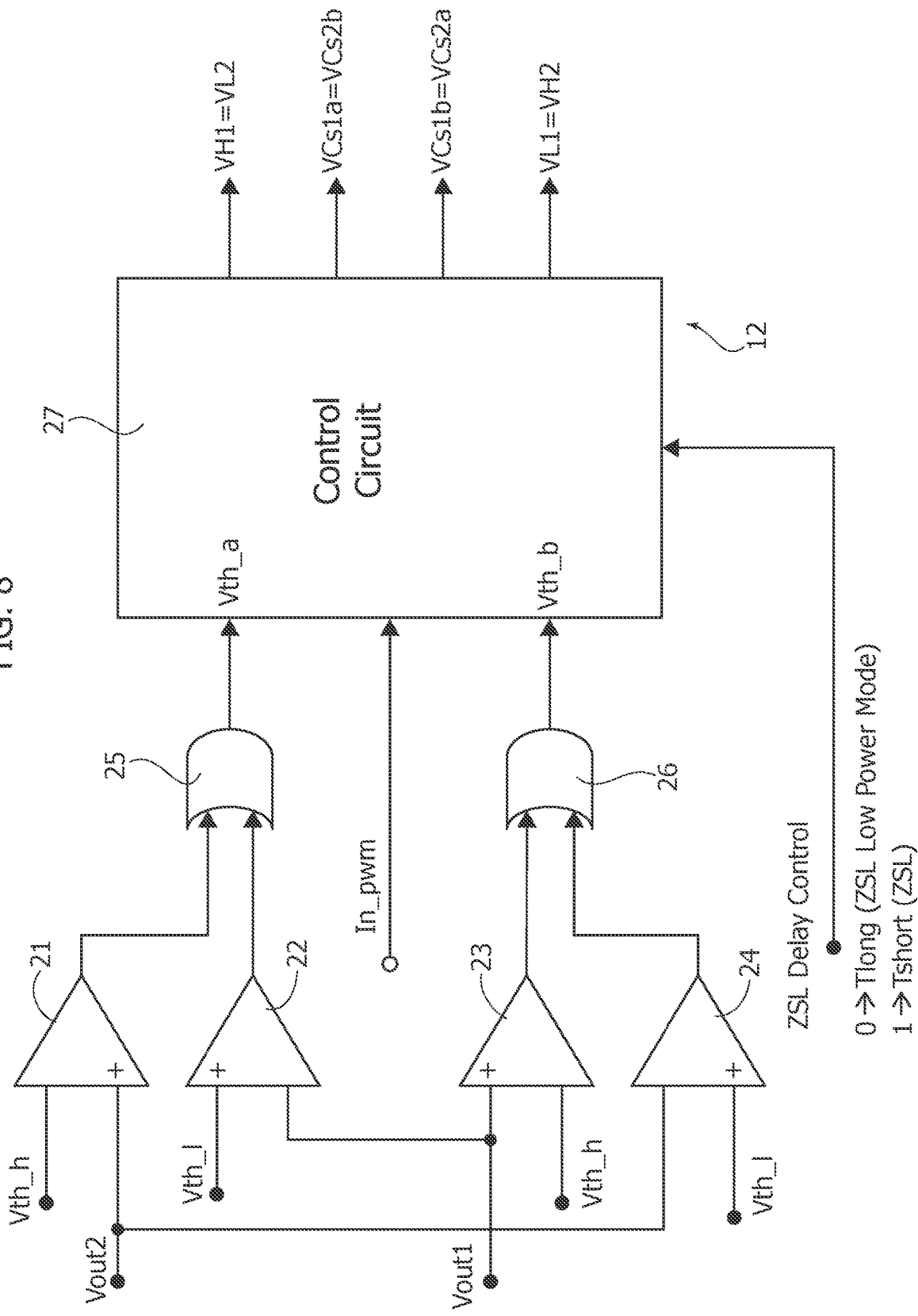
FIG. 8 is a diagram exemplary of control circuitry in a switching amplifier in embodiments according to the present description.

As exemplified in FIG. 8 (by way of direct comparison with FIG. 4) the ZSL Delay Control command (various ways of generating this command will be discussed in the following) can be injected into the control circuit block 27 that controls switching on and off of the switches S1 and S2.

Advantageously, the long value Tlong is one order of magnitude longer than the short value Tshort (e.g., 30 ns v. 3 ns).

With the ZSL Delay Control command at a second logic level (e.g., "1"), the delay between turning off the power transistors and turning on the switches S1, S2 has a second, "short" value Tshort (for example 3 ns), namely shorter that the value Tlong, and system operation returns to a normal ZSL configuration.

The quantitative values (3 ns and 30 ns) are, of course, merely exemplary.

Figure 9:
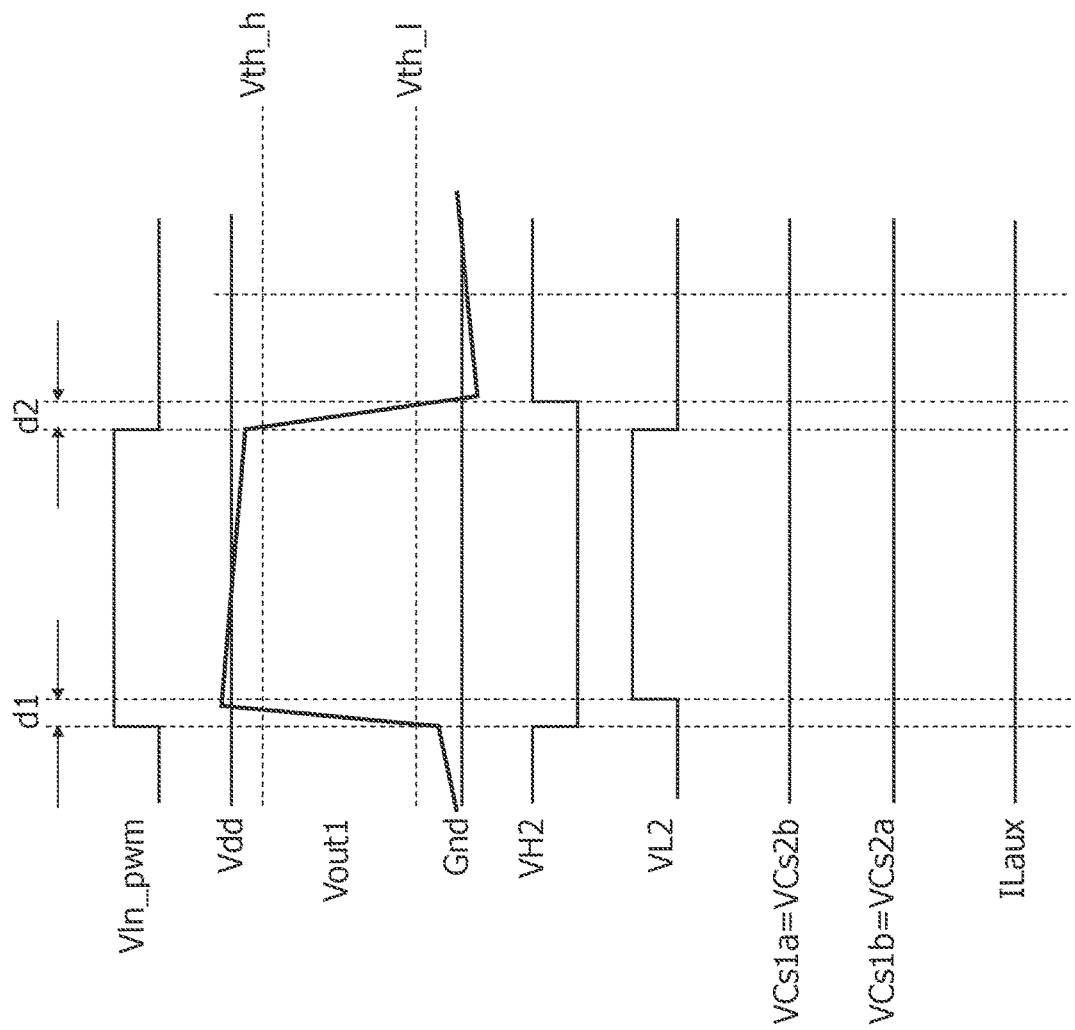
FIG. 9 includes various diagrams sharing a common time scale exemplary of the possible time behavior of certain signals which may occur in an in a switching amplifier in embodiments according to the present description.

More generally: the first delay Tshort is advantageously selected shorter than the time between switching the first pair of transistors to a non-conductive state and switching the second pair of transistors to a conductive state: in that way, operation (with medium-high output power level) is essentially as illustrated in FIG. 3; and the second delay Tlong is advantageously selected longer than the time between switching the first pair of transistors to a non-conductive state and switching the second pair of transistors to a conductive state: in that way the switches S1, S2 are not made conductive (they are not reached "fast enough" by a command to become conductive before the second pair of transistors are switched toa conductive state), and operation (with low output power level or in a quiescent or nearly quiescent condition) is essentially as illustrated in FIG. 9.

FIG. 9 shows by way of direct comparison with FIG. 6 possible time behaviors of the following signals: the complementary PWM-modulated generally labeled Vin_pwm; the signal Vout1 (the signal Vout2 will exhibit the same behavior in a complementary manner, that is, with Vout2 "low" when Vout1 is "high" and Vout2 "high" when Vout1 is "low"); the on and off conditions of the high-side and low-side transistors (H2 and L2, respectively) in the half bridge HB2 (here again, only the behavior of the half bridge HB2 is exemplified, with the same behavior mirrored in the half bridge HB1 in a complementary way (180° phase offset); the control signals VCs1$a$=VCs2$b$ and VCs1$b$=VCs2$a$ I intended to be possibly applied to the switches S1 and S2; and the (zero or nearly zero, that is, quiescent or nearly quiescent) current ILaux through the auxiliary inductance Laux.

Delays d1, d2 (that is Tlong) between power-off of the power transistor involved and (notional) turn-on time of the associated auxiliary switch S1 or S2 (applied in response to the command signal ZSL Delay Control) are illustrated at the top of FIG. 9.

Comparison of FIG. 9 with FIG. 6 shows that, in response to ZSL low power mode being commanded (as portrayed in FIG. 9) the control signals VCs1$a$=VCs2$b$ and VCs1$b$=VCs2$a$ end up by being (steadily) zero insofar as the "long" delay Tlong applied as shown by d1, d2 at the top of FIG. 9 results in that is the switches S1 and S2 are not activated, thus avoiding any increase in the dissipated power.

As noted, such an increase (which is unnecessitated for the reasons explained in the foregoing) would be non-negligible in the case of an output signal that is zero or nearly zero: for instance, ZSL low power mode as discussed herein—that is, the ZSL control circuitry 12 refraining from switching the first switch S1 and the second switch S2 to the conductive state in response to switching the first pair of transistors to a non-conductive state and to switching the second pair of transistors to a conductive state—may involve a reduction of the quiescent current in a bridge circuit of the order of 40% (e.g., from 30 mA to 17 mA). Of course, these values are merely exemplary and not limiting.

Figure 10:
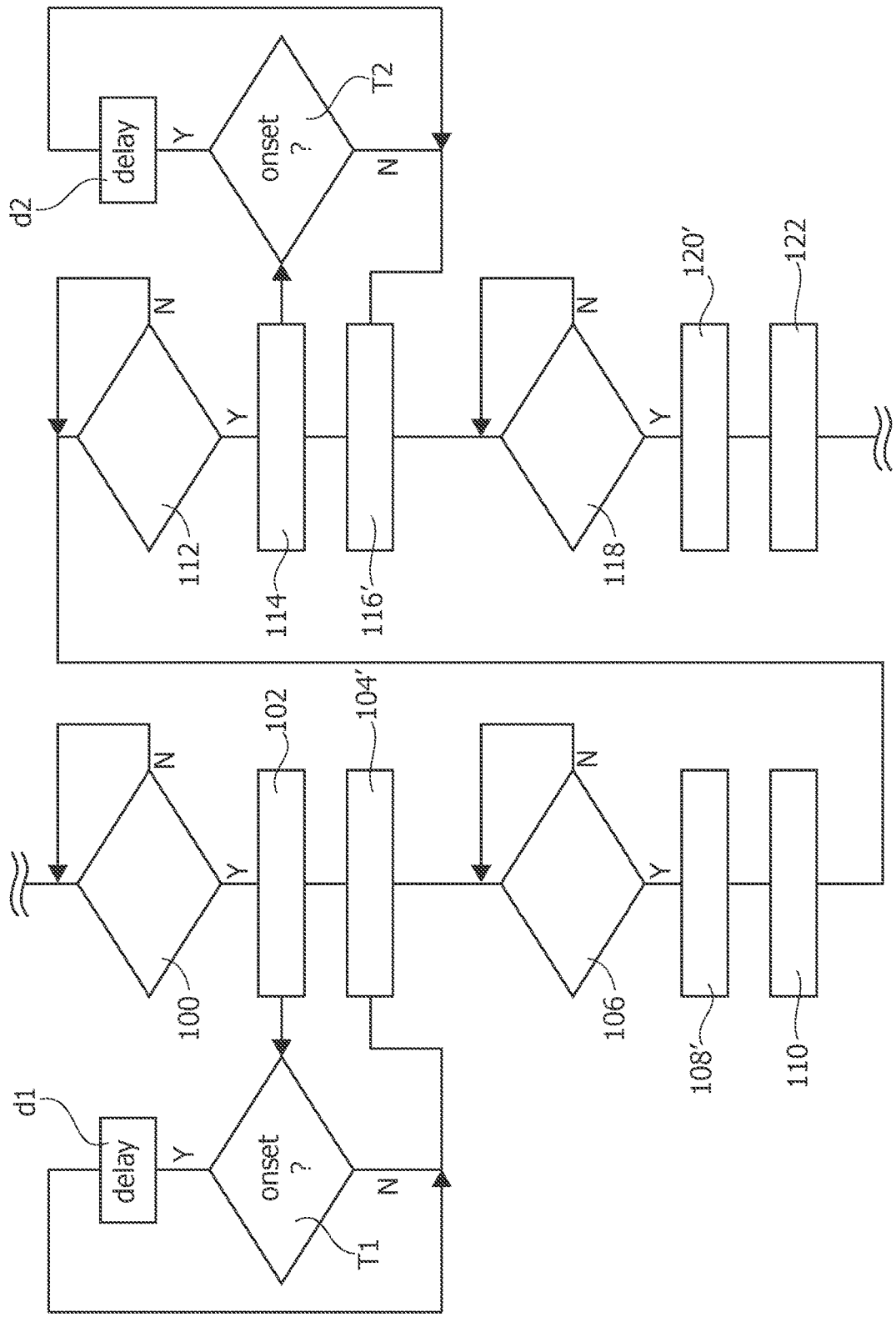
FIGS. 10 and 11 are flow charts exemplary of possible modes of operation of a switching amplifier in embodiments according to the present description.

The flow-chart of FIG. 10 shows, by way of direct comparison with the flow-chart of FIG. 5, a possible implementation of operation as discussed herein, starting from a same initial condition, namely: VL1=VH2=1 (that is, L1 and H2 conductive); VH1=VL2=0 (that is, H1 and L2 non-conductive); and VCs1$a$=Vcs2$b$=0 and VCs1$b$=VCs2$a$=0 (that is, S1 and S2 non-conductive).

The blocks labelled with a same number in FIGS. 5 and 10 have the same meaning, namely:

100: check as to whether a transition (e.g., 0→1) has occurred in the input signal In_pwm (here again the suffixes 1 and 2 are not reproduced for the reasons given previously).

102: given a positive outcome in block 100, the currently active power transistors are turned off (e.g., VL1=VH2 1→0).

104': the switches CS1-CS2 are activated, that is made conductive (e.g., Vcs1=Vcs2 0→1).

106: check as to whether the "turn-off" threshold has been reached (e.g., Vth_a 0→1).

108': given a positive outcome in block 106, the switches S1, S2 are turned off, that is made non-conductive (e.g., Vcs1=Vcs2 1→0).

110: the currently inactive power transistors are turned on (e.g., VH1=VL2 0→1).

112: check as to whether a new transition has occurred in the input signal In_pwm.

114: given a positive outcome in block 112, the currently active power transistors are turned off (e.g., VH1=VL2 1→0).

116': the switches CS1-CS2 are activated, that is, made conductive (e.g., Vcs1=Vcs2 0→1).

118: check as to whether the "turn-off" threshold has been reached (e.g., Vth_b 0→1).

120': given a positive outcome in block 116, the switches S1, S2 are turned off, that is made non-conductive (e.g., Vcs1=Vcs2 1→0).

122: the currently inactive power transistors are turned on (e.g., VL1=VH2 0→1).

Contrary to the flow-chart of FIG. 5, in the flow-chart of FIG. 10 transitioning from the block 102 (VL1=VH2 1→0) to the block 104' (e.g., Vcs1$b$=Vcs2$a$ 0→1) and transitioning from the block 114 (VH1=VL2 1→0) to the block 116' (e.g., Vcs1$a$=Vcs2$b$ 0→1) is conditioned on the outcome of a test (exemplified by blocks T1 and T2 for simplicity) where the possible onset of a low power/quiescence condition is checked, for instance, by checking (e.g. based on sensing on the load L) if Iload<Iripple (peak).

In response to a negative outcome (N) of the test T1 and the test T2, the system transitions from the block 102 to the block 104' and from the block 114 to the block 116' immediately (e.g., with a "short" delay Tshort of 3 ns, for instance), thus operating in the "normal" ZSL mode.

Conversely, in response to a positive outcome (Y) of the test T1 and the test T2, the system transitions from the block 102 to the block 104' and from the block 114 to the block 116', with a "long" delay Tlong, e.g., 30 ns, as represented by the blocks d1 and d2 (see also the top diagram in FIG. 9) with the system operating in the ZSL low-power mode.

While represented separately for clarity, in the exemplary case above, the tests T1 and T2 can be a same test e.g., based on sensing on the load L if Iload<Iripple (peak).

If (in absolute value) Iload<Iripple(peak), an adequate delay (Tlong) is introduced as indicated by d1, d2 before turning on the auxiliary switches S1 and S2. The delay (e.g., 30 ns) is selected in such a way that, thanks to the energy stored in the output inductance, the output voltage completes the transition and, depending on whether it is the falling or rising edge, exceeds the threshold Vth_l or Vth_h (see FIG. 9).

As a result, in the low power ZSL mode the switches S1, S3 are not activated, as the power corresponding to the phase reached is switched on directly.

Conversely, if (in absolute value) Iload>Iripple(peak) the delay is bypassed, and the auxiliary switches S1, S2 are switched on immediately (or with a negligible delay), with the thresholds Vth_a or Vth_b still at 0. The situation is thus returns to being that of FIG. 6.

A substantially similar mode of operation, still based on a flow-chart as illustrated in FIG. 10, may involve performing the tests T1 and T2 as respective tests to identify low-power operation or quiescent condition performed performed by replacing a test based on current sensing on the load L (Iload<Iripple (peak) with a voltage threshold test, namely by checking if Vds(L1) and Vds(H2) are higher than a threshold Vthr (test T1) and if Vds(L2) and Vds(H1) are higher than the threshold Vthr (test T2).

Vds denotes the drain-source voltage of the transistors involved, namely the transistors L1, H2 and the transistors L2, H1.

In such a case, the comparison of the current in the load Iload and that the ripple (peak) current Tripple (peak) in the filter inductance is performed simply by comparing the drain-source voltages Vds of the low side drivers L1, L2 and high side drivers H1, H2 with respect to predefined thresholds, at the instant of shutdown.

The current in these transistors H1, H2, L1, L2 is given by the sum of Tripple and Tout, if Iripple(Peak)<Iload, the voltage Vds will be slightly higher than zero on the transistors L1, L2, and slightly lower than Vdd on the transistors H1, H2. The current threshold(s) therefore become voltage thresholds; these are easier to manage insofar also they are referred to Vdd for the high-side transistors H1, H2 and to the ground GND for the low-side transistors L1, L2.

The flow-chart of FIG. 11 illustrates a further possible implementation of operation as discussed herein, starting from a same initial condition, namely: VL1=VH2=1 (that is, L1 and H2 conductive); VH1=VL2=0 (that is, H1 and L2 non-conductive); and VCs1a=Vcs2b=0 and VCs1b=Vcs2a=0 (that is, S1 and S2 non-conductive).

The blocks labelled with a same number in FIGS. 5, 10 and 11 have the same meaning, namely:

100: check as to whether a transition (e.g., 0→1) has occurred in the input signal In_pwm (here again the suffixes 1 and 2 are not reproduced for the reasons given previously).
102: given a positive outcome in block 100, the currently active power transistors are turned off (e.g., VL1=VH2 1→0).
104': the switches CS1-CS2 are activated, that is made conductive (e.g., Vcs1=Vcs2 0→1).
106: check as to whether the "turn-off" threshold has been reached (e.g., Vth_a 0→1).
108': given a positive outcome in block 106, the switches S1, S2 are turned off, that is made non-conductive (e.g., Vcs1=Vcs2 1→0).
110: the currently inactive power transistors are turned on (e.g., VH1=VL2 0→1).
112: check as to whether a new transition has occurred in the input signal In_pwm.
114: given a positive outcome in block 112, the currently active power transistors are turned off (e.g. VH1=VL2 1→0).
116': the switches CS1-CS2 are activated, that is, made conductive (e.g., Vcs1=Vcs2 0→1).
118: check as to whether the "turn-off" threshold has been reached (e.g., Vth_b 0→1).
120': given a positive outcome in block 116, the switches S1, S2 are turned off, that is made non-conductive (e.g., Vcs1=Vcs2 1→0).
122: the currently inactive power transistors are turned on (e.g., VL1=VH2 0→1).

Essentially, in the flow chart of FIG. 11, the possible application of the delays d1 and d2 (ZSL low-power mode) is conditioned to more elaborate testing wherein the tests T1 and T2 of FIG. 10 are replaced each by a couple of tests T11, T12 and T21, T22.

In the test T11 a check is made as to the (logic) value of a variable HighCurr that is set to a first logic value (e.g., "1") in response to the load current Tout being higher than a threshold Ithr.

In response to a positive outcome (Y) of the test T11 the system transitions from the block 102 to the block 104' "immediately" (e.g., with a short delay Tshort of 3 ns, for instance), thus operating in the "normal" ZSL mode, after (re)setting, in a block 1001, the variable HighCurr to a second logic value (e.g., "0").

In response to a negative outcome (N) of the test T11 the system transitions to the second test T12 where a check is made as to whether Vds(L1) is higher than a threshold Vthr.

In response to a negative outcome (N) of the test T12 the system transitions from the block 102 to the block 104' "immediately" (e.g., with a short delay Tshort of 3 ns, for instance), thus operating in the "normal" ZSL mode, after setting, in a block 1002, the variable HighCurr to the first logic value (e.g., "1").

In response to a positive outcome (Y) of the test T12 the system transitions from the block 102 to the block 104' with a "long" delay Tlong, e.g., 30 ns, as represented by the block d1 with the system operating in the ZSL low-power mode.

In a corresponding manner, in the test T21 a check is made as to the (logic) value of a variable HighCurr that is set to a first logic value (e.g., "1") in response to the load current Tout being higher than a threshold Ithr.

In response to a positive outcome (Y) of the test T21 the system transitions from the block 114 to the block 116' "immediately" (e.g., with a short delay Tshort of 3 ns, for instance), thus operating in the "normal" ZSL mode, after (re)setting, in a block 2001, the variable HighCurr to a second logic value (e.g., "0").

In response to a negative outcome (N) of the test T21 the system transitions to the second test T22 where a check is made as to whether Vds(L2) is higher than a threshold Vthr.

In response to a negative outcome (N) of the test T22 the system transitions from the block 114 to the block 116' "immediately" (e.g., with a short delay Tshort of 3 ns, for instance), thus operating in the "normal" ZSL mode, after setting, in a block 2002, the variable HighCurr to the first logic value (e.g., "1").

In response to a positive outcome (Y) of the test T22 the system transitions from the block 114 to the block 116' with a "long" delay Tlong, e.g., 30 ns, as represented by the block d2 with the system operating in the ZSL low-power mode.

Essentially, in the flow chart of FIG. 11, sensing is performed only on the low side drivers L1, L2 of the two branches.

As in the previous cases (flow chart of FIG. 10), the signal In_pwm is considered slightly ahead of the output transition (in the order of tens of ns), with the output signal Vout1 in phase with the input signal and the output signal Vout2 in counter-phase (see FIG. 2 for reference).

The flow chart of FIG. 11 is based on the (reasonable) assumption that between two input edges the condition of the output current level does not change significantly. This assumption holds provided the switching frequency is much higher than of the modulating frequency, which is normally the case in switching (Class-D) amplifiers.

The solution of the flow chart of FIG. 11 changes the delay (from Tshort to Tlong, for example from 3 ns to 30 ns—again, these are purely exemplary values) when the drain-source voltage Vds of the transistors L1, L2 at the time instant considered exceeds a certain threshold Vthr.

In the example considered, the variable "HighCure" goes to 1 if the threshold Vthr is exceeded and is reset at the next edge, with a Tshort delay regardless of the current value.

A substantially similar mode of operation, based on a flow-chart as illustrated in FIG. 11, can be adopted in case operation with very low distortion is desirable.

Solutions as discussed so far, may lead to a level of distortion that can be regarded as a limiting factor in high-end applications.

For that reason, the solution exemplified in FIG. 11 can be further improved paying attention to harmonic distortion.

A principle underlying such improvement is countering transitions between the "standard" ZSL mode and the ZSL "low power" mode (in either direction) that might occur on each half wave of the audio signal (e.g., with a lowest frequency fmin=20 Hz), when the benefits related to the reduction of the current at rest would be negligible.

To that effect a timer TimerHighCurrent can be activated by a crossing Vds L1>Vthr or Vds L2>0 Vthr.

The timer which starts from a Tmax value and which decreases with a fixed clock until it reaches zero level after a certain period of time.

If the threshold current is not (again) exceeded during this period, the delay returns to Tlong, otherwise, if the threshold current is again exceeded during this period, the timer returns to Tmax.

Having regard to such a low-distortion option, the portions of the flow-chart of FIG. 11 including the tests T11, T12 and T21, T22 lend themselves to be read as follows.

In the test T11 a check is made as to whether the timer TimerHighCurr has a value higher than zero.

In response to a positive outcome (Y) of the test T11 the system transitions from the block 102 to the block 104' "immediately" (e.g., with a short delay Tshort of 3 ns, for instance), thus operating in the "normal" ZSL mode, after decrementing by one the value of the timer TimerHighCurr.

In response to a negative outcome (N) of the test T11 the system transitions to the second test T12 where a check is made as to whether Vds(L1) is higher than a threshold Vthr.

In response to a negative outcome (N) of the test T12 the system transitions from the block 102 to the block 104' "immediately" (e.g., with a short delay Tshort of 3 ns, for instance), thus operating in the "normal" ZSL mode, after setting the timer TimerHighCurr to its maximum value Tmax.

In response to a positive outcome (Y) of the test T12 the system transitions from the block 102 to the block 104' with a "long" delay Tlong, e.g., 30 ns, as represented by the block d1 with the system operating in the ZSL low-power mode.

In a corresponding manner, in the test T21 a check is made as to whether the timer TimerHighCurr has a value higher than zero.

In response to a positive outcome (Y) of the test T21 the system transitions from the block 102 to the block 104' "immediately" (e.g., with a short delay Tshort of 3 ns, for instance), thus operating in the "normal" ZSL mode, after decrementing by one the value of the timer TimerHighCurr.

In response to a negative outcome (N) of the test T21 the system transitions to the second test T22 where a check is made as to whether Vds(L2) is higher than a threshold Vthr.

In response to a negative outcome (N) of the test T22 the system transitions from the block 102 to the block 104' "immediately" (e.g., with a short delay Tshort of 3 ns, for instance), thus operating in the "normal" ZSL mode, after setting the timer TimerHighCurr to its maximum value Tmax.

In response to a positive outcome (Y) of the test T22 the system transitions from the block 102 to the block 104' with a "long" delay Tlong, e.g., 30 ns, as represented by the block d2 with the system operating in the ZSL low-power mode.

In an audio amplifier, Tmax is advantageously selected such that its duration is half of the period of the lowest reproducible frequency, for example 30 ms for systems with fmin=20 Hz.

It is otherwise noted that functional improvement can be applied in all cases of current detection previously described.

The solutions discussed in the foregoing, based on a direct or indirect measurement of the output current Tout, are expected to operate in a noisy environment (such a switching systems).

Operation in such a context is facilitated/improved by processing the signal before the modulation stage, in its analog form or, in the case of power audio systems with digital input, in the digital domain.

To that effect the peak value of the input signal (in absolute value) can be analyzed, verifying if the input signal can lead to an output current Iload greater than Tripple (peak).

Figure 12:
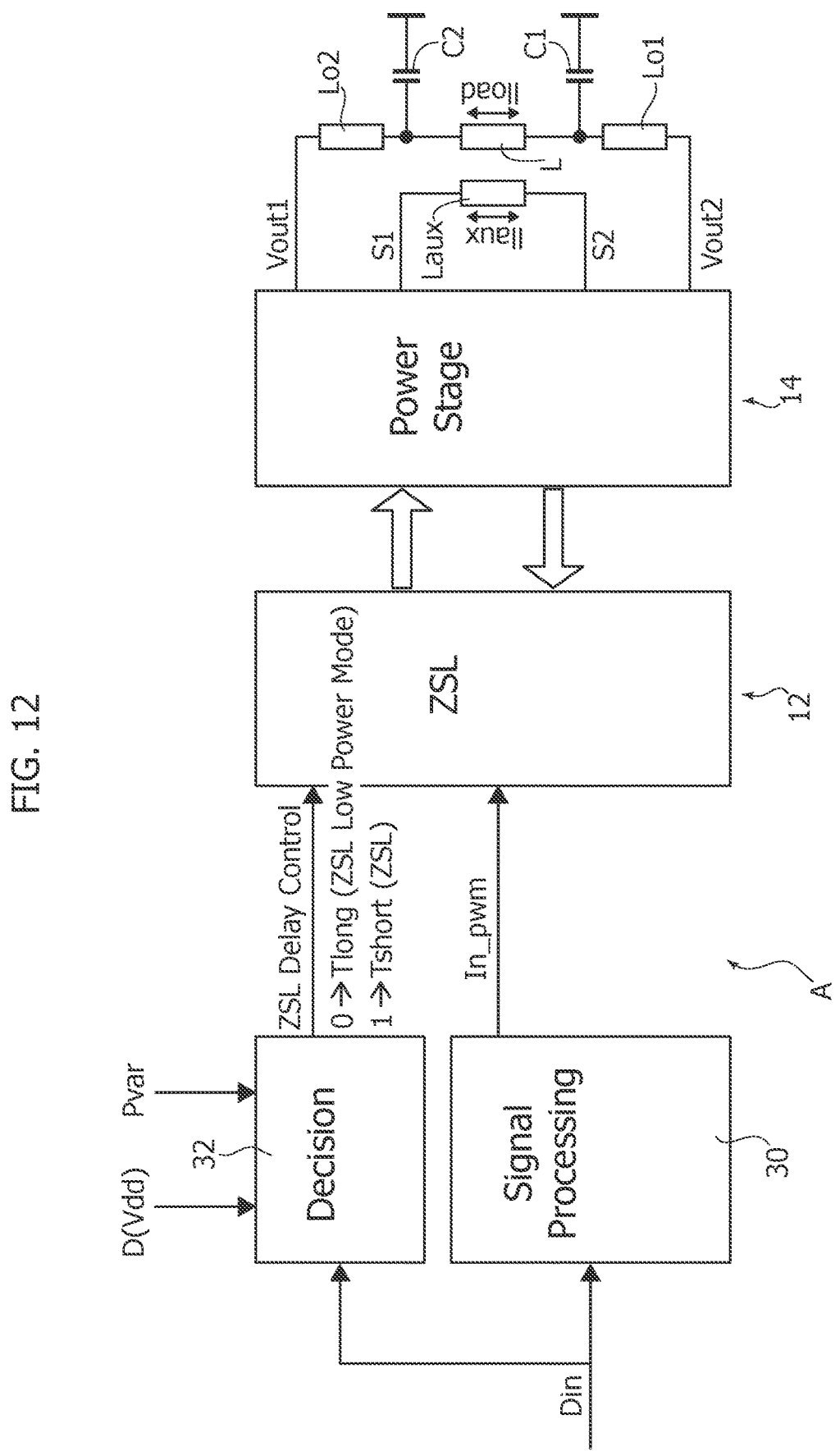
FIG. 12 is a general block diagram of a switching amplifier in embodiments according to the present description.

Such an approach (which makes it unnecessary to measure the current or rely on time relationships with the transitions 1>0 and 0>1 of the PWM output signal) is exemplified in FIG. 12, where the same high-level block representation of FIG. 1 is again referred to.

In FIG. 12 an input signal processing block 30 is illustrated configured to receive as an input a digital signal Din containing the audio signal, encoded using pulse coded modulation or PCM or other formats (Bitstream, DSD, and so on).

In FIG. 12 an input signal analysis (ISA) and decision block 32 is also shown.

As illustrated, the block 32 receives the digital signal Din along with: a digital signal D(Vdd) with the information on the (voltage) value Vdd used to supply the power stage 14; and one or more setting parameters Pvar that take into account factor that can change the ripple current value in Lo1, Lo2 and the output current for a same voltage output, that is essentially Lo, Fsw and Rload, to be defined a priori.

The ZSL Delay Control signal can thus be produced that indicates (e.g., to the block 27 in the ZSL control circuity 12) whether the system is in a medium-high power operation or in low-power operation so that "standard" ZSL operation (Tshort) or "low-power" ZSL operation (Tlong) can be commanded as discussed previously.

Figure 13:
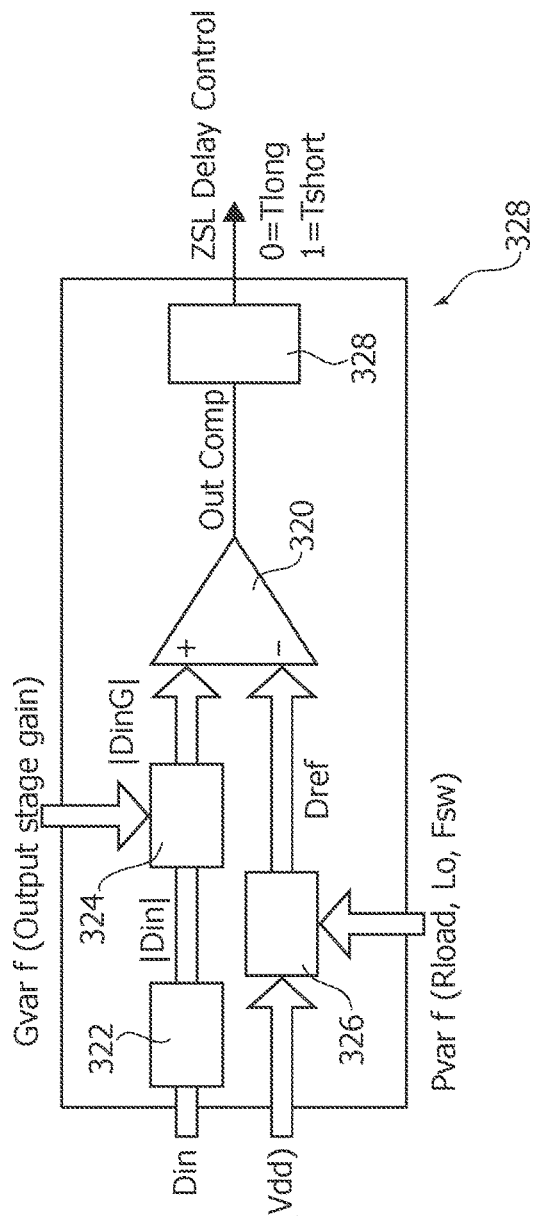
FIG. 13 is a functional block diagram illustrative of possible implementation details of embodiments.

FIG. 13 shows a possible implementation of the block 32 in FIG. 12.

The block 32 is configured to decide whether the level of the digital input word (PCM or otherwise encoded) is such that to suggest that the ZSL switches S1, S2 should act with a short delay (e.g., Tshort, ~3 ns) or a long (e.g., Tlong, ~30 ns) in "standard" ZSL mode or in "low-power" ZSL mode, respectively.

The block 32 as illustrated is built around a comparator 320 that receives on one input (e.g., non-inverting) the absolute value of the signal |Din| (expected to be proportional to the output voltage) obtained via a modulus (absolute value) circuit 322—of any known type—weighted in a multiplier module 324 by a factor that takes into account the gain of the output stage (via a parameter Gvar included in the set of parameters Pvar).

The other (e.g., inverting) input of the comparator 320 receives a digital reference level Dref, which corresponds to the peak value of the output voltage such that the current in the load equals the peak of the ripple current in the inductance.

Since the ripple current is a function of Vdd, Dref can be derived from D(Vdd) through a scaling factor (included in the set of parameters Pvar) via a scaling module 326. This parameter essentially depends on the absolute value of the impedance of the load L (e.g., Zload (min), the switching frequency and on value of the output filter inductance.

For a given application, these parameters are fixed, known and not particularly critical.

Advantageously, the level Dref is set such that even in the worst case the output from the comparator 320 OutComp is equal to 1 for a current Tout equal to or higher than the ripple voltage Tripple.

Figure 14:
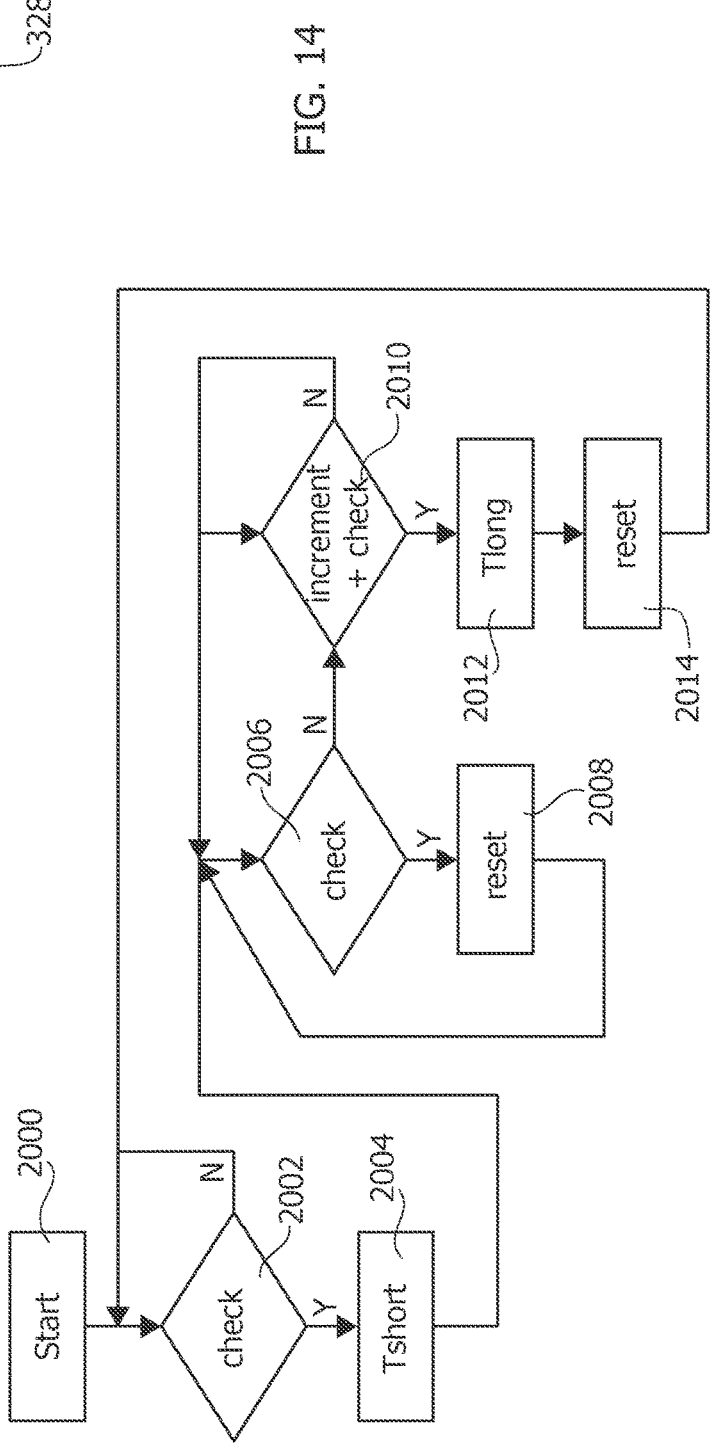
FIG. 14 is a flow chart exemplary of possible operation of the elements detailed in FIG. 13.

The block 328 in FIG. 13 is exemplary of circuitry configured (e.g., via SW) to implement the procedure exemplified by the flow-chart of FIG. 14. Advantageously this procedure can be clocked by the frame clock of the input (e.g., PCM) signal.

The blocks in the flow-chart of FIG. 14 have the following meaning:

2000—start with timer reset and the signal ZSL Delay Control set to Tlong (e.g., logic 0—low-power ZSL).

2002—check if the output Out Comp from the comparator 320 is equal to 1; if the outcome is negative, (N) return downstream of block 2002 (low-power ZSL maintained).

2004—in response to positive outcome (Y) from check at 2002 (output Out Comp from the comparator 320 equal to 0) set the signal ZSL Delay Control set to Tshort (e.g., logic 1—switch to standard ZSL).

2006—check if output Out Comp from the comparator 320 is equal to 1; if outcome positive (Y), reset timer in block 2008 and return upstream of block 2006 (standard ZSL maintained).

2008—in response to outcome of check in block 2006 being negative (N), go to block 2010.

2010—increment timer by 1 and check if higher than a hold threshold; if outcome negative (N), return upstream of block 2006 (standard ZSL maintained).

2012—in response to outcome of check in block 2010 being positive (Y) set the signal ZSL Delay Control set to Tlong (e.g., logic 0—switch to low power ZSL).

2014—reset timer and return upstream of block 2002.

The concept underlying this procedure is similar to the concept underlying the procedures discussed in connection with FIGS. 10 and 11: the ZSL Delay Control output transitions from 0 to 1 as soon as the absolute value of the output current 'Tout' approaches the ripple peak value Tripple (peak). The opposite transition occurs (only) after a Thold time defined by the timer (e.g., 30 ms) after the last transition from 1 to 0 of the output signal Out Comp from the comparator 320.

Figure 15:
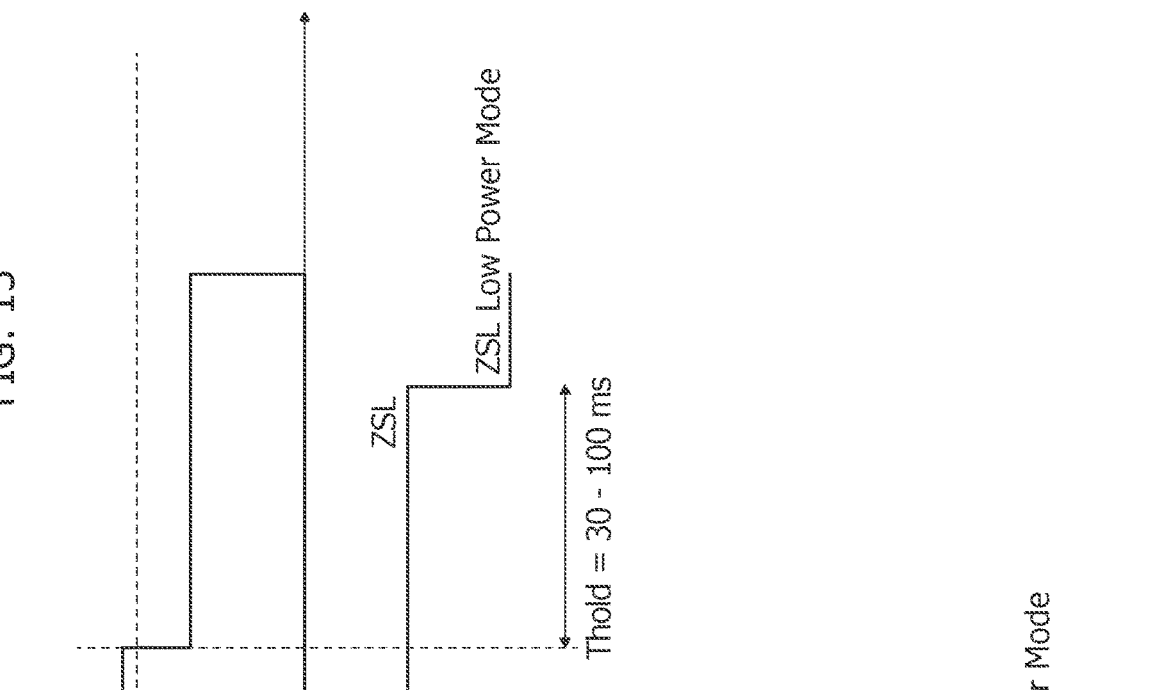
FIGS. 15 and 16 are further time diagrams exemplary of possible operation of the elements detailed in FIGS. 12 to 14.
Figure 16:
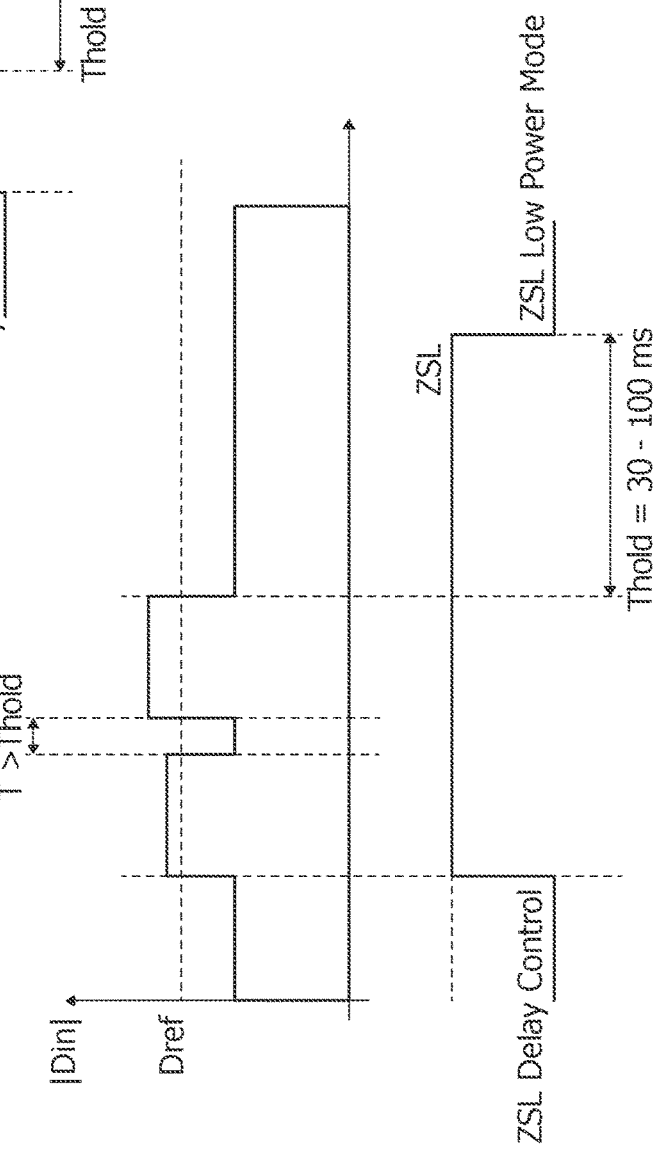

The time diagrams of FIGS. 15 and 16 are possible examples of this kind of operation.

Figure 17:
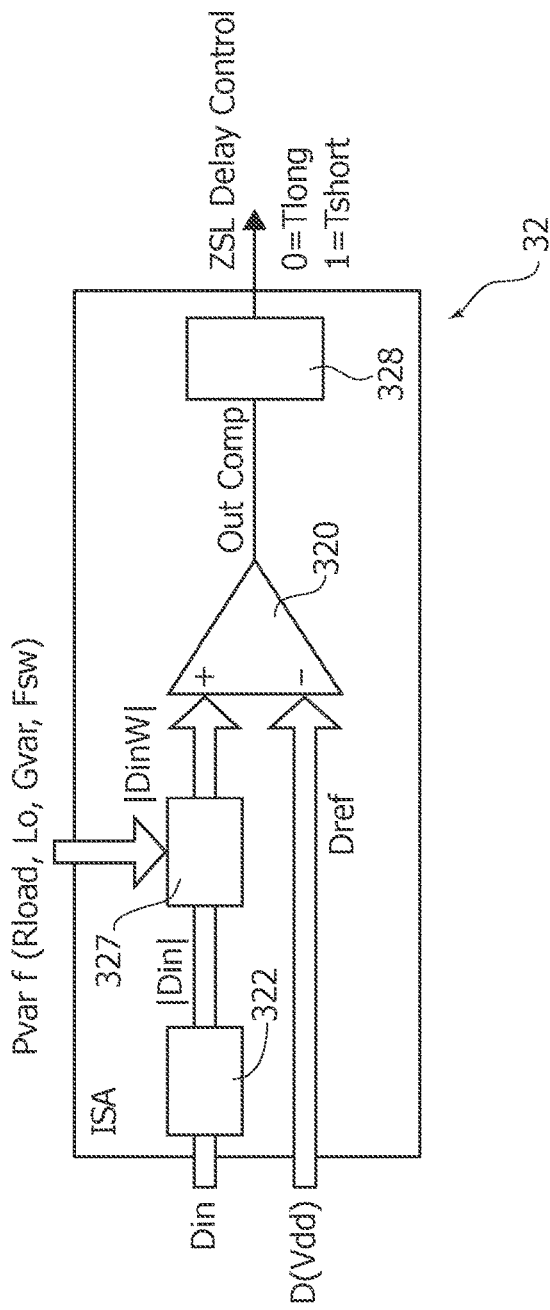
FIG. 17 is a functional block diagram illustrative of possible implementation details of embodiments.

FIG. 17 illustrates a possible alternative implementation of the block 32.

In this implementation, the inverting input of the comparator 320 receives as a reference value Dref (digitized) value D(Vdd) of the supply voltage.

The non-inverting input of the comparator 320 again receives the absolute level of the (digital) input signal |Din| weighed (level-shifted in a level shifter module 327) by a factor that depends on the value of the output inductance, on the modulus of the minimum load impedance, on the final stage gain and the switching frequency.

As noted, for a given application, these are all fixed parameters.

The implementation of FIG. 17 takes advantage of the low criticality of the system, that facilitates passing from |Din| to |DinW| (to be compared with a correspondingly weighed reference DrefW at the output of the level shifter 327, namely a weighted value obtained as a function of the factors set out above. Such level shifting can be achieved simply by shifting the values in binary string if a power of two of the value of is used.

Figure 18:
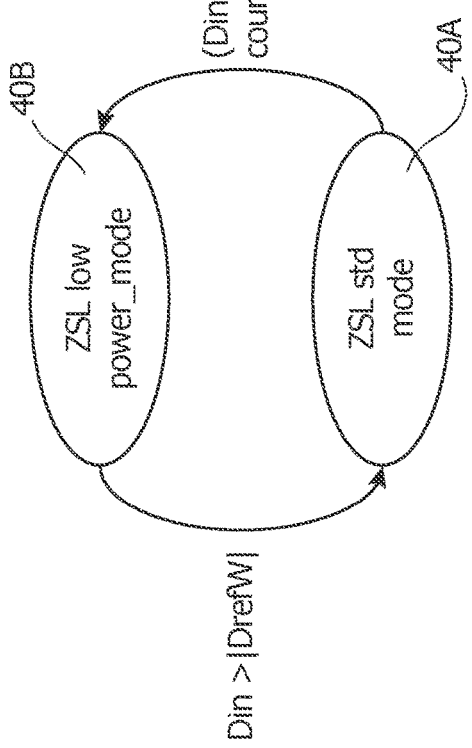
FIG. 18 is a graph illustrative of possible operation of a finite state machine (FSM) that may be included in embodiments of the present description.

Processing downstream of the comparator 320 can be implemented with a simple two-state finite state machine (FSM) 40 as illustrated in FIG. 18, such a FSM "toggling": from a first state 40A ("standard" ZSL mode) to a second state 40B ("low-power" ZSL mode) in response to Din being found to be less than Dref with a counter between 30 ms and 100 ms, for instance; and from the second state 40B ("low-power" ZSL mode) to the first state 40A ("standard" ZSL mode) in response to Din being found to be higher than DrefW.

Without prejudice to the underlying principles, the details and embodiments may vary, even significantly, with respect to what has been described by way of example only without departing from the extent of protection.

The claims are an integral part of the technical teaching provided herein in respect of embodiments.

The extent of protection is determined by the annexed claims.

The invention claimed is:

1. A circuit, comprising:
   a switching circuit stage comprising first and second half bridges, each half bridge comprising a high-side transistor and a low-side transistor with an output node between the high-side transistor and the low-side transistor, the output nodes of the first and second half bridges configured for supplying an electrical load via respective filter networks between the output nodes and the load;
   control circuitry configured to control alternate switching sequences of the high-side and low-side transistors in the first and second half bridges wherein a first pair of transistors comprising the high-side transistor in one of the half bridges and the low-side transistor in the other of the half bridges is switched to a non-conductive state, and a second pair of transistors comprising the high-side transistor in the other of the half bridges and the low-side transistor in the one of the half bridges is switched to a conductive state; and
   a current flow line between the output nodes in the first half bridge and the second half bridge, the current flow line comprising an inductance having opposed terminals coupled to a first switch and a second switch, wherein the first switch and the second switch are selectively switchable between a non-conductive state and at least one conductive state; and
   wherein the control circuitry is configured:
      in a first operation mode where the switching circuit stage is operating at a first power level, to switch the first switch and the second switch to the at least one conductive state at intervals in said alternate switching sequences in response to switching the first pair of transistors to the non-conductive state and to switching the second pair of transistors to the conductive state; and
      in a second operation mode where the switching circuit stage is operating at a second power level lower than the first power level, to refrain from switching the first switch and the second switch to the at least one conductive state at intervals in said alternate switching sequences in response to switching the first pair of transistors to the non-conductive state and to switching the second pair of transistors to the conductive state.

2. The circuit of claim 1, wherein:
   in the first operation mode, the control circuitry is configured to send a switching command to the first switch and the second switch to switch to the at least one conductive state with a first delay with respect to switching the first pair of transistors to the non-conductive state; and
   in the second operation mode, the control circuitry is configured to send a switching command to the first switch and the second switch to switch to the at least one conductive state with a second delay with respect to switching the first pair of transistors to the non-conductive state;

wherein the second delay is longer than the first delay.

3. The circuit of claim 2:

wherein the first delay is shorter than a time between switching the first pair of transistors to the non-conductive state and switching the second pair of transistors to the conductive state; and wherein the second delay is longer than a time between switching the first pair of transistors to the non-conductive state and switching the second pair of transistors to the conductive state.

4. The circuit of claim 1, wherein the control circuitry is configured to produce a control signal having a first logic level indicative of the switching circuit stage operating at the first power level to select the first operation mode and having a second logic level indicative of the switching circuit stage operating at the second power level to select the second operation mode.

5. The circuit of claim 4, wherein the control circuitry comprises input-side circuitry configured to:

receive an input signal driving said switching circuit stage as well an input reference signal, the input reference signal preferably being a function of the supply voltage applied to the switching circuit stage;

perform a comparison of the absolute value of the input signal with the input reference signal; and produce said control signal with:

said first logic level in response to the comparison indicating that the absolute value of the input signal is higher than the input reference signal; and said second logic level in response to the comparison indicating that the absolute value of the input signal is lower than the input reference signal.

6. The circuit of claim 5, wherein the input-side circuitry comprises scaling circuitry configured to perform scaling of the input signal and/or the input reference signal prior to said comparison.

7. The circuit of claim 5, wherein the input-side circuitry comprises a delay feature configured to delay issue of said control signal with said second logic level in response to the comparison indicating that the absolute value of the input signal is lower than the input reference signal.

8. The circuit of claim 1, wherein the control circuitry is configured to:

sense the intensity of the load current supplied to said electrical load;

compare the intensity of the load current with a current intensity threshold;

operate in the first operation mode in response to the sensed intensity of the load current being higher than the current intensity threshold; and operate in the second operation mode in response to the sensed intensity of the load current being lower than the current intensity threshold.

9. The circuit of claim 1, wherein the control circuitry is configured to:

sense voltage drops across the high-side and low-side transistors in said first pair of transistors comprising the high-side transistor in one of the half bridges and the low-side transistor in the other of the half bridges at a time of being switched to the non-conductive state;

perform a comparison of the voltage drops sensed against a voltage threshold;

operate in the first operation mode in response to the sensed voltage drops being higher than the voltage threshold; and operate in the second operation mode in response to the sensed voltage drops being lower than the voltage threshold.

10. The circuit of claim 1, wherein the control circuitry is configured to:

sense low-side voltage drops across the low-side transistors in the one or the other of the half bridges at the time of being switched to a non-conductive state;

perform a comparison of the low-side voltage drops sensed against a low-side voltage threshold;

operate in the first operation mode in response to the sensed voltage drops being higher than the low-side voltage threshold; and operate in the second operation mode in response to the sensed voltage drops being lower than the low-side voltage threshold.

11. The circuit of claim 10, wherein the control circuitry is configured to:

set a counter to a top value in response to the sensed voltage drops being higher than the low-side voltage threshold, the counter decrementing to zero in a zeroing interval;

check whether the sensed low-side voltage drops further exceed the low-side voltage threshold by being again higher than the low-side voltage threshold during the zeroing interval of the counter;

in response to the sensed low-side voltage drops further exceeding the low-side voltage threshold being again higher than the low-side voltage threshold during the zeroing interval of the counter, continue operation in the first operation mode and set again said counter to said top value; and in response to the sensed voltage drops no longer exceeding the low-side voltage threshold by being lower than the low-side voltage threshold during the zeroing interval of the counter, transition to operation in the second operation mode.

12. The circuit of claim 1, wherein the first and second operation modes are alternative operation modes.

13. The circuit of claim 1, further comprising first and second capacitances coupled with the output nodes of the first half bridge and the second half bridge.

14. The circuit of claim 1, wherein, in the second operation mode, the control circuitry refrains from switching the first switch and the second switch to said at least one conductive state for a delay period longer than provided in the first operation mode to switch the first switch and the second switch to said at least one conductive state.

15. A device, comprising:

a PWM modulator configured to receive an input signal and to produce therefrom a PWM-modulated drive signal;

a circuit coupled with the PWM modulator, wherein said circuit comprises:

a switching circuit stage comprising first and second half bridges, each half bridge comprising a high-side transistor and a low-side transistor with an output node between the high-side transistor and the low-side transistor, the output nodes of the first and second half bridges configured for supplying an electrical load;

control circuitry configured, in response to the PWM-modulated drive signal, to control alternate switching sequences of the high-side and low-side transistors in the first and second half bridges wherein a first pair of transistors comprising the high-side transistor in one of the half bridges and the low-side transistor in the other of the half bridges is switched to a non-conductive state, and a second pair of transistors comprising the high-side transistor in the other of the half bridges and the low-side transistor in the one of the half bridges is switched to a conductive state; and a current flow line between the output nodes in the first half bridge and the second half bridge, the current flow line comprising an inductance having opposed terminals coupled to a first switch and a second switch, wherein the first switch and the second switch are selectively switchable between a non-conductive state and at least one conductive state; and wherein the control circuitry is configured:
  in a first operation mode where the switching circuit stage is operating at a first power level, to switch the first switch and the second switch to the at least one conductive state at intervals in said alternate switching sequences in response to switching the first pair of transistors to the non-conductive state and to switching the second pair of transistors to the conductive state; and
  in a second operation mode where the switching circuit stage is operating at a second power level lower than the first power level, to refrain from switching the first switch and the second switch to the at least one conductive state at intervals in said alternate switching sequences in response to switching the first pair of transistors to the non-conductive state and to switching the second pair of transistors to the conductive state; and respective low pass filter networks coupled to the output nodes of the first and second half bridges.

16. The device of claim 15, comprising said electrical load coupled to the circuit and supplied from the output nodes of the first and second half bridges via said respective low pass filter networks.

17. A method of operating a class-D amplifier, the method comprising:
  receiving an input signal;
  generating a PWM signal based on the input signal;
  alternatively switching first and second half-bridges of the class-D amplifier in an alternate switching sequence based on the PWM signal, the half-bridges having respective output nodes coupled to a load via respective filter networks, wherein alternatively switching the first and second half-bridges in the alternate switching sequence comprises:
    turning on a first pair of transistors of the half-bridges when a second pair of transistors of the half-bridges is off, and
    turning on the second pair of transistors when the first pair of transistors is off, wherein the first pair of transistors comprises a high-side transistor in one of the half-bridges and a low-side transistor in the other of the half-bridges, and the second pair of transistors comprises a high-side transistor in the other of the half-bridges and a low-side transistor in the one of the half-bridges;
  in a first operation mode when operating at a first power level, turning on a first switch coupled to the output node of the first half-bridge and a second switch coupled to the output node of the second half-bridge at intervals in the alternate switching sequence between turning off the first pair of transistors and turning non the second pair of transistors; and
  in a second operation mode when operating at a second power level lower than the first power level, refraining from turning on the first switch and the second switch at intervals in the alternate switching sequence between turning off the first pair of transistors and turning non the second pair of transistors;
  wherein an auxiliary inductance is coupled between the first switch and the second switch.

18. The method of claim 17, wherein the PWM signal is a fixed frequency signal.

19. The method of claim 18, wherein the fixed frequency signal has a frequency between 2 MHz and 2.5 MHz.

20. The method of claim 17, wherein the first and second switches are further coupled to a reference voltage node via respective resistors.

21. The method of claim 17, wherein the first and second switches are further coupled to a reference voltage node via respective third and fourth switches, the method further comprising:
  turning on the third switch when the first switch is off and turning off the third switch when the first switch is on; and
  turning on the fourth switch when the second switch is off and turning off the fourth switch when the second switch is on.

22. The method of claim 17, wherein the first and second switches are further coupled to a reference voltage node via respective low-pass filters.

23. The method of claim 17, wherein a capacitor and a resistor are coupled in series between the first and second switches.

24. The method of claim 17, further comprising obtaining an amplified replica of the input signal at said respective low pass filter networks coupled to the output nodes of the first and second half bridges.

* * * * *